United States Patent
Henderson et al.

(10) Patent No.: US 9,557,386 B2
(45) Date of Patent: Jan. 31, 2017

(54) POWER MANAGEMENT IN AN ACTIVITY MONITORING DEVICE

(71) Applicant: NIKE, Inc., Beaverton, OR (US)

(72) Inventors: Kristofer Henderson, Seattle, WA (US); Michael Lapinsky, Seattle, WA (US); Edward S. Lowe, Jr., Seattle, WA (US); Michael Noone, Seattle, WA (US); James Zipperer, Seattle, WA (US)

(73) Assignee: NIKE, Inc., Beaverton, OR (US)

( * ) Notice: Subject to any disclaimer, the term of this patent is extended or adjusted under 35 U.S.C. 154(b) by 431 days.

(21) Appl. No.: 13/744,945

(22) Filed: Jan. 18, 2013

(65) Prior Publication Data

US 2013/0226486 A1 Aug. 29, 2013

Related U.S. Application Data

(60) Provisional application No. 61/588,646, filed on Jan. 19, 2012.

(51) Int. Cl.
*G01R 31/36* (2006.01)
*H02J 7/00* (2006.01)

(52) U.S. Cl.
CPC ............ *G01R 31/3606* (2013.01); *H02J 7/00* (2013.01); *H02J 7/0075* (2013.01); *G01R 31/36* (2013.01); *G01R 31/3651* (2013.01)

(58) Field of Classification Search
USPC ........................................................ 702/63
See application file for complete search history.

(56) References Cited

U.S. PATENT DOCUMENTS

| 5,565,759 A * | 10/1996 | Dunstan ................ 320/135 |
| 6,513,532 B2 | 2/2003 | Mault et al. |
| 8,907,631 B1 * | 12/2014 | Gurries et al. ......... 320/138 |
| 2003/0169047 A1 * | 9/2003 | Chen .................... 324/425 |
| 2006/0226843 A1 | 10/2006 | Al-Anbuky et al. |
| 2008/0048616 A1 | 2/2008 | Paul et al. |
| 2008/0200312 A1 | 8/2008 | Tagliabue |
| 2008/0218310 A1 | 9/2008 | Alten et al. |
| 2009/0048540 A1 * | 2/2009 | Otto et al. .............. 600/595 |
| 2010/0072948 A1 | 3/2010 | Sun et al. |
| 2010/0188054 A1 * | 7/2010 | Asakura et al. ......... 320/161 |
| 2010/0191490 A1 | 7/2010 | Martens et al. |
| 2011/0187329 A1 * | 8/2011 | Majima et al. ......... 320/149 |

(Continued)

FOREIGN PATENT DOCUMENTS

| JP | 1995239373 A | 9/1995 |
| JP | H10-032933 | 2/1998 |

(Continued)

OTHER PUBLICATIONS

Search Report and Written Opinion for International application No. PCT/US2013/022219 mailed Jul. 15, 2013.
Mar. 7, 2012—(WO) ISR and WO—App. No. PCT/US2011/060187.

*Primary Examiner* — Paul D Lee
(74) *Attorney, Agent, or Firm* — Banner & Witcoff, Ltd.

(57) ABSTRACT

Batteries for an athletic activity monitoring device may be managed in both charged and discharged state to provide more accurate state information and/or expected charge times. Additionally or alternatively, various power management processes may be executed to maximize an amount of battery charge remaining.

8 Claims, 23 Drawing Sheets

(56) References Cited

U.S. PATENT DOCUMENTS

| | | | |
|---|---|---|---|
| 2011/0234173 A1* | 9/2011 | Kao | H02J 7/0073 |
| | | | 320/150 |
| 2012/0049796 A1* | 3/2012 | Fukatsu | 320/109 |
| 2012/0050529 A1 | 3/2012 | Bentley | |
| 2012/0249065 A1* | 10/2012 | Bissonette et al. | 320/109 |
| 2013/0110428 A1* | 5/2013 | Sun et al. | 702/63 |
| 2014/0125281 A1* | 5/2014 | Mitsutani | 320/109 |

FOREIGN PATENT DOCUMENTS

| | | | |
|---|---|---|---|
| JP | 1999250939 A | 9/1999 | |
| JP | 2001186251 A | 7/2001 | |
| JP | 2003151645 A | 5/2003 | |
| JP | 2006262605 A | 9/2006 | |
| WO | 0033031 A1 | 6/2000 | |
| WO | 2006065679 A2 | 6/2006 | |
| WO | 2008/010085 A2 | 1/2008 | |
| WO | 2010146811 A1 | 12/2010 | |

\* cited by examiner

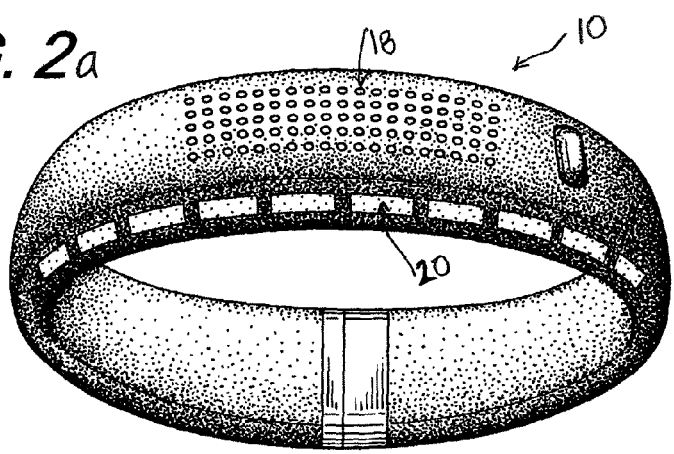
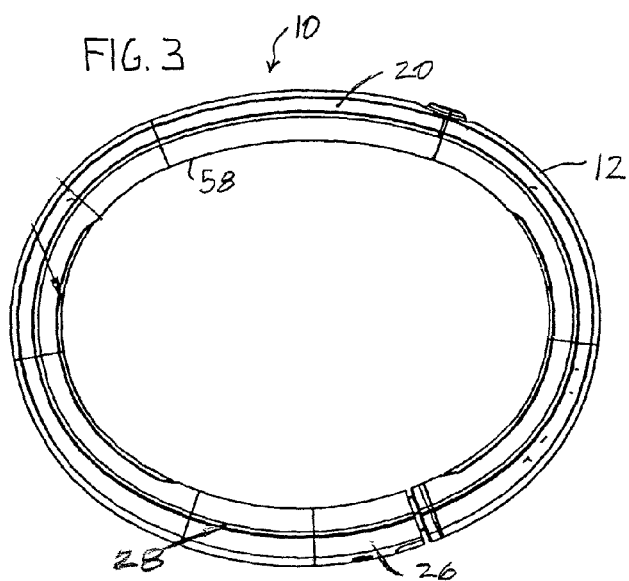
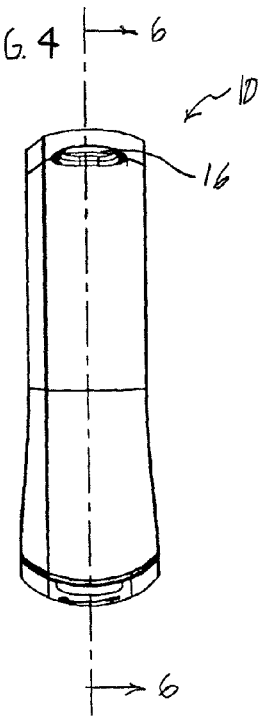

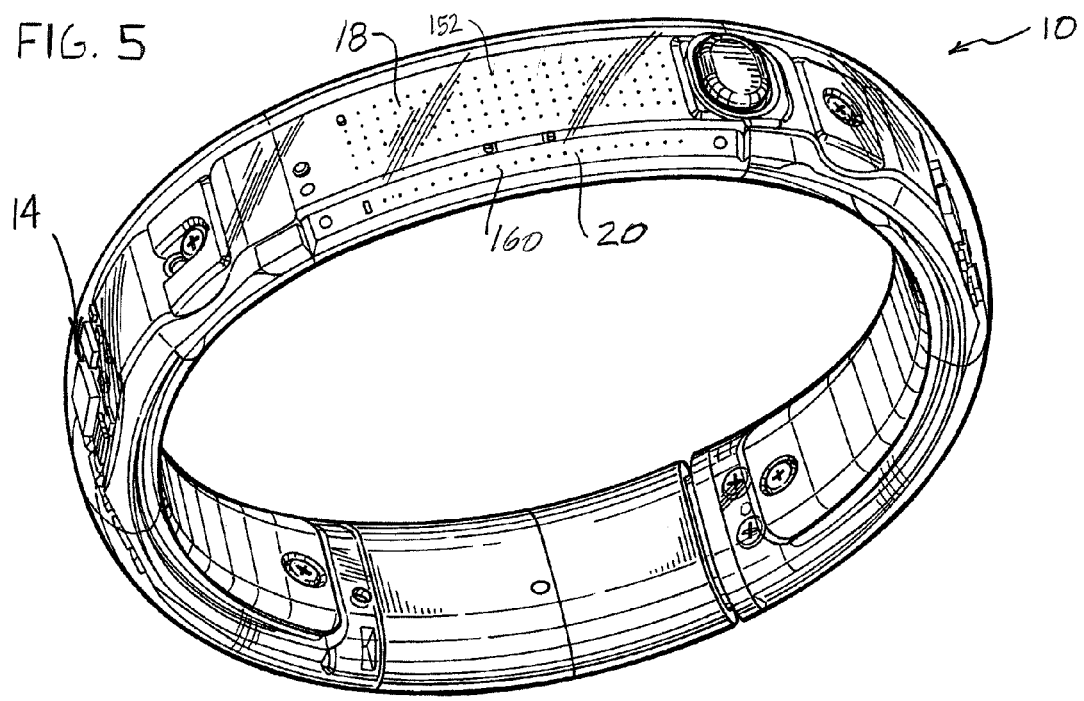

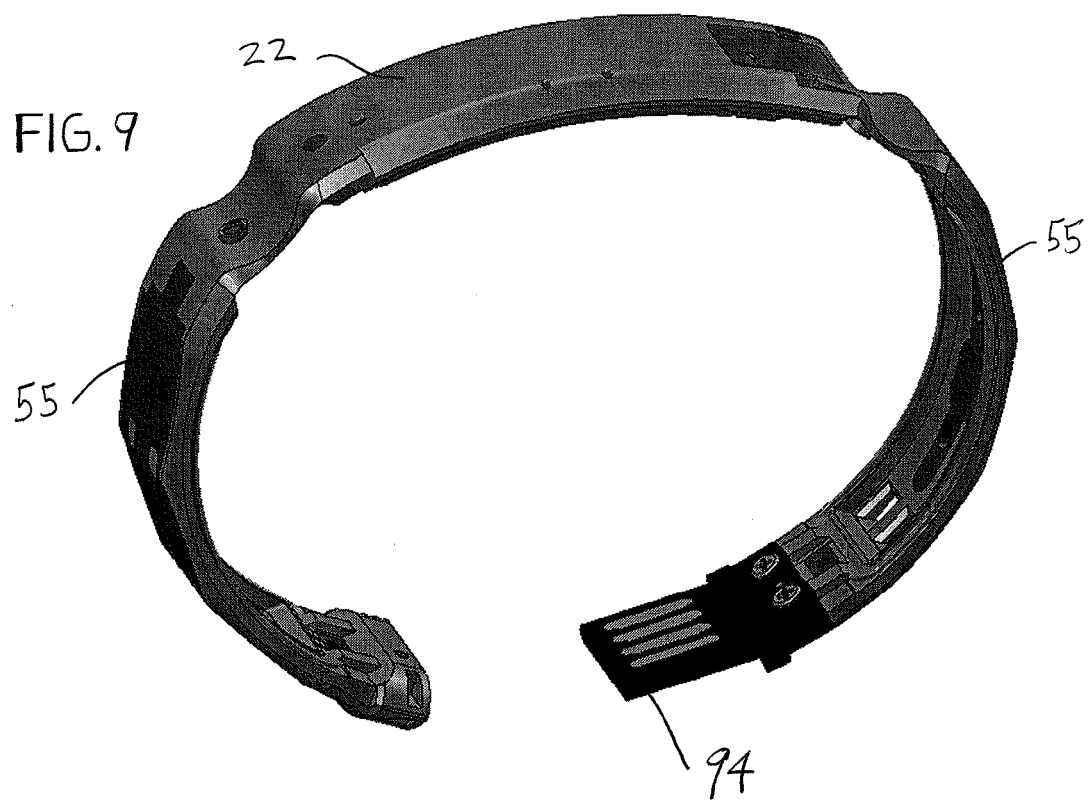

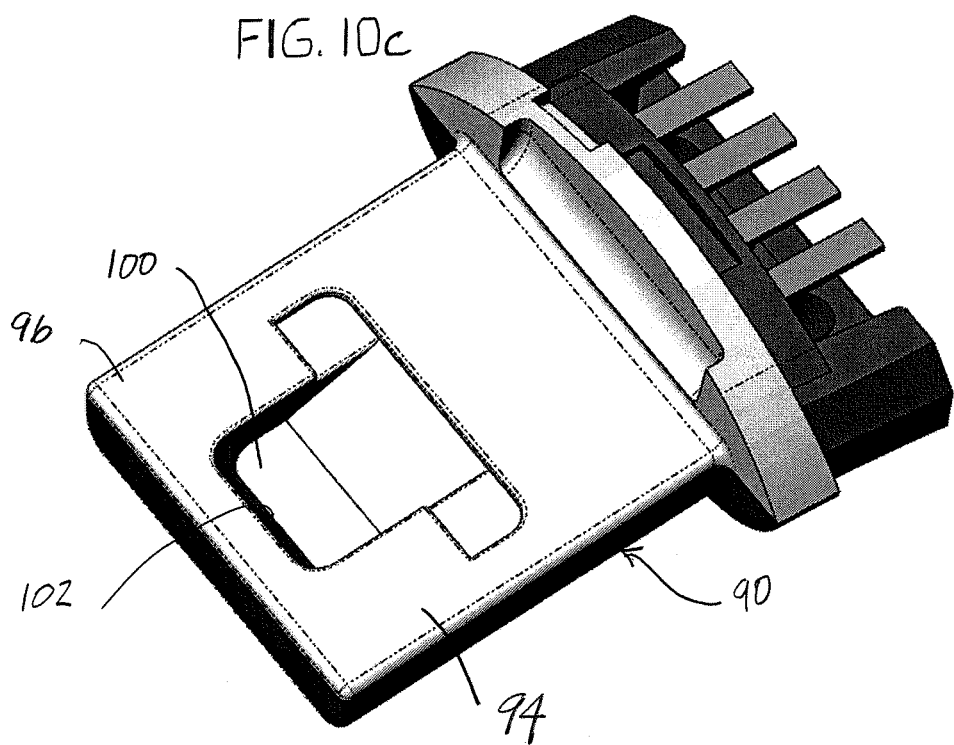

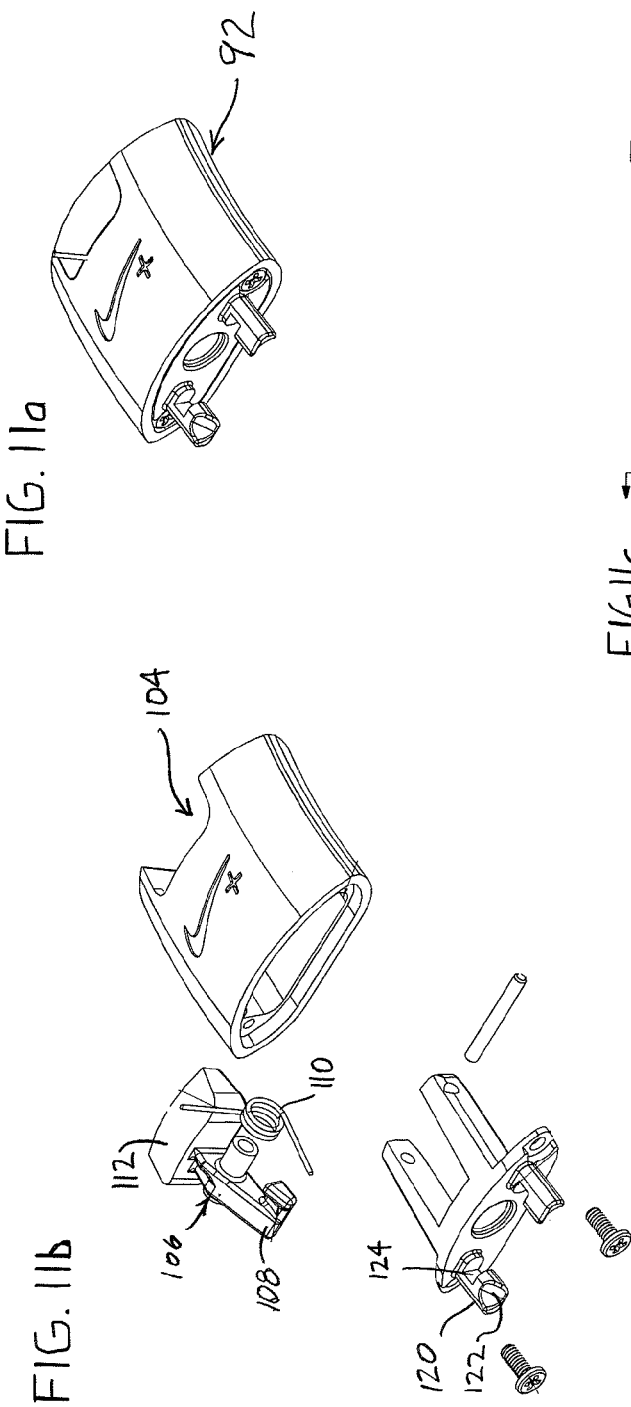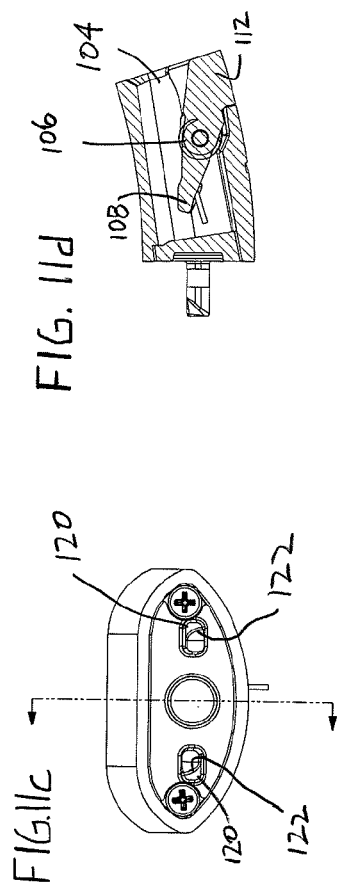
FIG. 11a
FIG. 11b
FIG. 11c
FIG. 11d

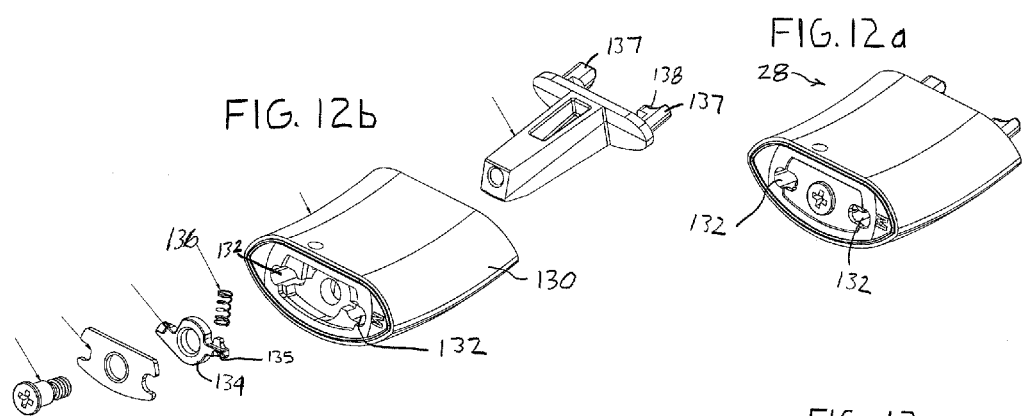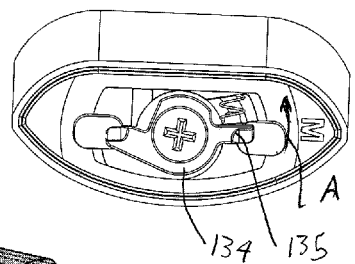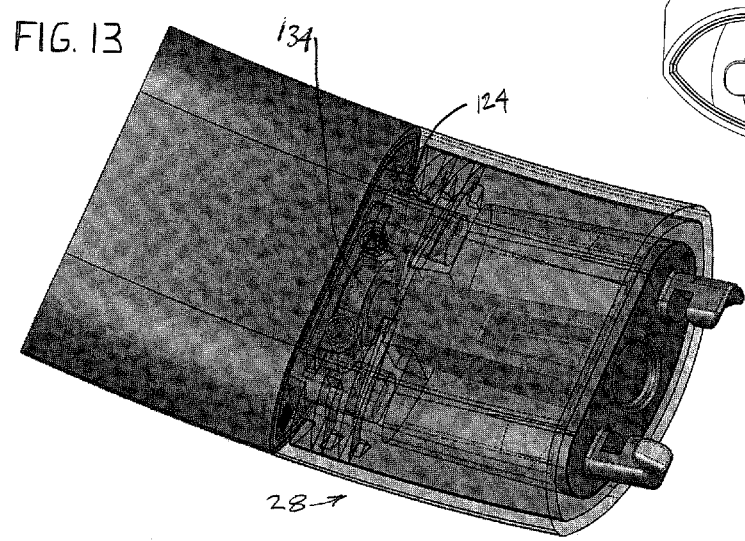

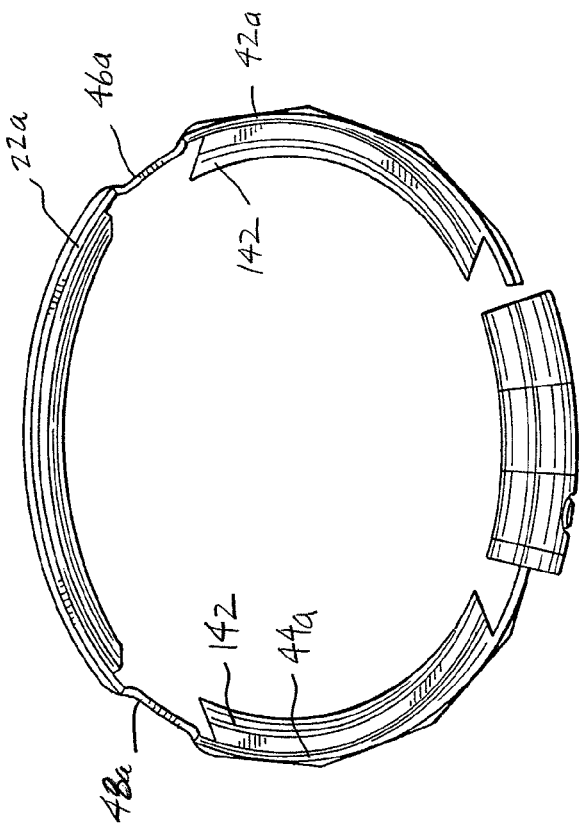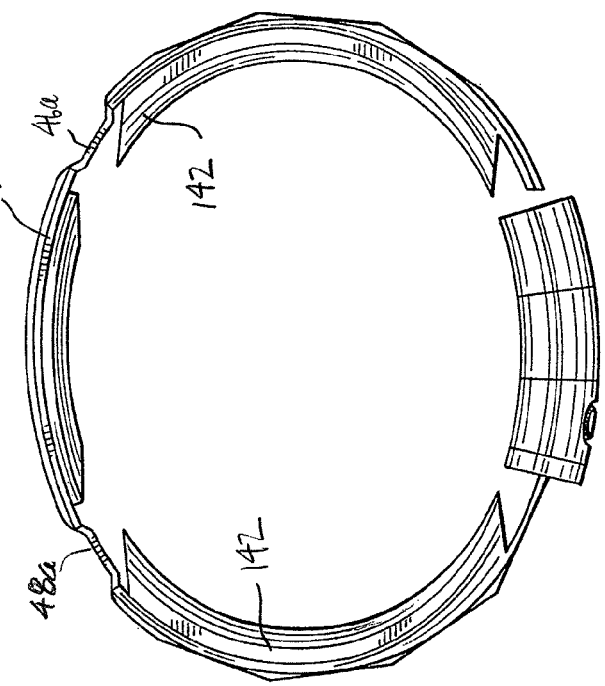

| DISCHARGE | | | CHARGE | |
|---|---|---|---|---|
| Small Battery Voltage (mvs) | Large Battery Voltage (mvs) | Capacity (%) | Small Battery Time To Charge (minutes) | Large Battery Time To Charge (minutes) |
| 2800 | 2800 | 0 | 87 | 101 |
| 3195 | 3179 | 1 | 86 | 100 |
| 3337 | 3324 | 2 | 86 | 99 |
| 3425 | 3415 | 3 | 85 | 99 |
| 3490 | 3479 | 4 | 84 | 98 |
| 3541 | 3530 | 5 | 83 | 97 |
| 3582 | 3569 | 6 | 82 | 96 |
| 3614 | 3602 | 7 | 82 | 95 |
| 3642 | 3630 | 8 | 80 | 94 |
| 3663 | 3652 | 9 | 80 | 93 |
| 3675 | 3669 | 10 | 79 | 92 |
| 3692 | 3691 | 15 | 75 | 88 |
| 3718 | 3717 | 20 | 71 | 83 |
| 3754 | 3753 | 30 | 63 | 74 |
| 3794 | 3793 | 40 | 55 | 65 |
| 3826 | 3826 | 50 | 47 | 56 |
| 3873 | 3870 | 60 | 39 | 47 |
| 3946 | 3944 | 70 | 31 | 38 |
| 4021 | 4027 | 80 | 23 | 29 |
| 4113 | 4118 | 90 | 16 | 20 |
| 4232 | 4219 | 100 | 1 | 1 |

FIG. 23

POWER MANAGEMENT IN AN ACTIVITY MONITORING DEVICE

CROSS-REFERENCE TO RELATED APPLICATION

This application claims the benefit of priority from U.S. Provisional Application Ser. No. 61/588,646, entitled "MULTI-ACTIVITY PLATFORM AND INTERFACE," and filed on Jan. 19, 2012. The content of the aforementioned application is hereby incorporated by reference in its entirety.

TECHNICAL FIELD

Aspects described herein generally relate to battery and/or power management. In particular, aspects provide battery and power management for an activity monitoring device.

BACKGROUND

Exercise and fitness have become increasingly popular and the benefits from such activities are well known. Various types of technology have been incorporated into fitness and other athletic activities. For example, a wide variety of portable electronic devices are available for use in fitness activity such as MP3 or other audio players, radios, portable televisions, DVD players, or other video playing devices, watches, GPS systems, pedometers, mobile telephones, pagers, beepers, etc. Many fitness enthusiasts or athletes use one or more of these devices when exercising or training to keep them entertained, record and provide performance data or to keep them in contact with others, etc.

Advances in technology have also provided more sophisticated athletic performance monitoring systems. Athletic performance monitoring systems enable easy and convenient monitoring of many physical or physiological characteristics associated with exercise and fitness activity, or other athletic performances including, for example, speed and distance data, altitude data, GPS data, heart rate, pulse rate, blood pressure data, body temperature, steps taken etc.

A discussion of features and advantages is referred to in the following detailed description, which proceeds with reference to the accompanying drawings.

SUMMARY

The following presents a general summary of various features in order to provide a basic understanding of at least some of its aspects. This summary is not an extensive overview of the invention. It is not intended to identify key or critical elements of the invention or to delineate the scope of the invention. The following summary merely presents some concepts of the invention in a general form as a prelude to the more detailed description provided below.

Aspects described herein provide a wearable device that in one exemplary embodiment is an athletic performance monitoring and tracking device having an electronic data storage type device.

According to one aspect of the invention, a USB device is used as part of an assembly having a wearable carrier. In addition, the carrier and/or the USB device may include a controller that communicates with a sensor to record and monitor athletic performance as an overall athletic performance monitoring system. The wearable device may include illuminating features configured to convey various types of information to the user.

Aspects described herein further include managing power within an activity monitoring device. For example, aspects may relate to charging and discharging of a battery within the monitoring device.

Other aspects and features are described throughout the disclosure.

BRIEF DESCRIPTION OF THE DRAWINGS

To understand various aspects, it will now be described by way of example, with reference to the accompanying drawings in which:

FIG. 2a is an alternative embodiment of the wearable device assembly;

FIG. 3 is a front view of the wearable device assembly shown in FIG. 2;

FIG. 4 is a side view of the wearable device assembly shown in FIG. 2;

FIG. 5 is a perspective view of the wearable device assembly shown in FIG. 2 wherein portions of the assembly are shown in transparent form to show internal components;

FIG. 9 is a perspective view of the spine member having a USB connector attached;

FIGS. 10a-10c are views of the USB connector;

FIGS. 11a-f are views of a receiver member and other components for a fastening mechanism used in the wearable device assembly and using the USB connector;

FIGS. 12a-c are views of a spacer member or expansion element used in the wearable device assembly;

FIG. 13 is a perspective view of the spacer member attached to the wearable device assembly;

FIGS. 21a-21d illustrate various spine member and battery configurations according to one or more aspects described herein;

FIG. 23 illustrates an example battery information look-up table according to one or more aspects described herein;

DETAILED DESCRIPTION

Figure 1:
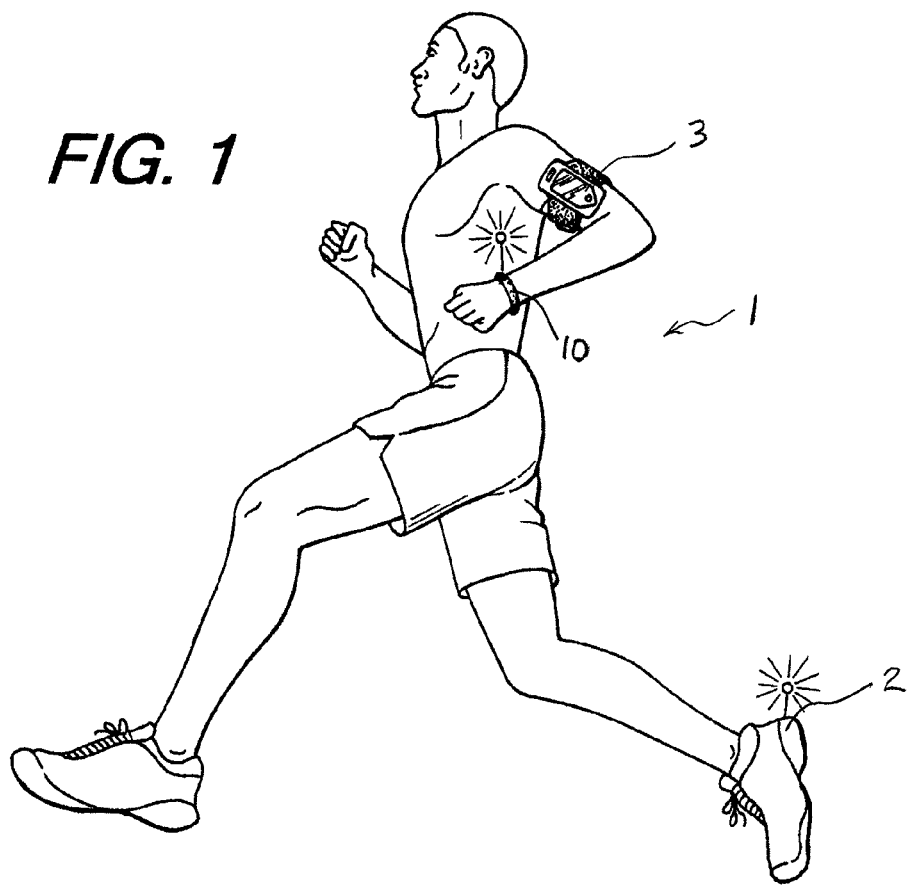
FIG. 1 is a view of a person utilizing an athletic performance monitoring and feedback system that in one exemplary embodiment of the invention includes a wearable device assembly having athletic functionality.

In the following description of various example embodiments of the invention, reference is made to the accompanying drawings, which form a part hereof, and in which are shown by way of illustration various example devices, systems, and environments in which aspects of the invention may be practiced. It is to be understood that other specific arrangements of parts, example devices, systems, and environments may be utilized and structural and functional modifications may be made without departing from the scope of the present invention. Also, while the terms "top," "bottom," "front," "back," "side," and the like may be used in this specification to describe various example features and elements of the invention, these terms are used herein as a matter of convenience, e.g., based on the example orientations shown in the figures. Nothing in this specification should be construed as requiring a specific three dimensional orientation of structures in order to fall within the scope of this invention.

General Description of Activity Monitoring Devices

Aspects described herein provide an activity monitoring device such as a wearable electronic device assembly having athletic functionality. In one exemplary embodiment, the wearable electronic athletic device assembly may comprise illuminable portions that convey athletic information to a wearer. Additionally, the wearable electronic athletic device may include a data transmission portion configured to connect to (directly or indirectly) another device. In one example, the wearable electronic athletic device may include a USB connector and storage device that may be connectable to a USB port of another device to transmit and receive data.

In one arrangement, the wearable electronic athletic device may include a USB storage device that may also be configured to act as a connector to secure two ends of the wearable electronic athletic device assembly to one another. The USB device is connected to a carrier that, in one exemplary embodiment, is a wristband.

The electronic wearable device assembly may further include a housing portion that supports a controller therein. The controller has associated components such as a power supply and circuitry. Various sensors may be operably associated with the controller including a three-axis accelerometer. The housing has a structural configuration wherein the housing is water-resistant as well as impact resistant.

In one or more arrangements, the controller may utilize a user interface having certain features to enhance the functionality of the device. For example, the wearable electronic athletic device assembly may include a display that may include an indicator system wherein performance data can be displayed or otherwise conveyed to the user. The display may include an LCD screen, a display comprised of a series of LED lights, an LED graphical user interface and the like. The data displayed on the display may be stored in an internal non-removable memory or a removable USB storage device. Additionally, the USB device of the wearable electronic athletic device may be plugged into a computer wherein performance data can be automatically uploaded to a remote site or mobile device for further processing, display and review. The device may also be configured for the user to be prompted in order to commence a data transfer operation. The device may also be capable of general wireless communication with other mobile devices or remote web sites.

In addition, the wearable athletic device may be worn in a variety of locations on a user's body including on a user's chest (e.g., a chest strap), around a user's wrist, around a user's arm, on a user's head, on a user's ankle or thigh, and the like.

In one exemplary embodiment, the display may include a display and an indicator system. The indicator system may display information corresponding to a level of activity of the user wearing the device assembly. The indicator system may include a plurality of light elements that are selectively illuminable to provide information. Each of the plurality of light elements may be illuminated in a plurality of colors. The display and indicator system may operate separately or in tandem to display indicia to the user.

In an additional exemplary embodiment, the device may include a spacer member that can adjust the size of the device to accommodate various users.

In still further exemplary embodiments, the device may interact with mobile devices and remote web sites to provide enhanced experiences to the user.

Example Embodiments of an Activity Monitoring Device

While aspects of the invention generally have been described above, the following detailed description, in conjunction with the Figures, provides even more detailed examples of athletic performance monitoring systems and methods in accordance with examples of this invention. Those skilled in the art should understand, of course, that the following description constitutes descriptions of examples of the invention and should not be construed as limiting the invention in any way.

FIG. 1 generally discloses a person utilizing an athletic performance monitoring and feedback system 1 that in one exemplary embodiment of the invention includes a wearable device assembly 10 having athletic functionality. As explained in greater detail below, the wearable device assembly 10 has a sensor associated therewith such as a three-axis accelerometer wherein the device 10 is capable of monitoring athletic activity or overall activity of the user. As shown in FIG. 1, the athletic performance monitoring and feedback system 1 may also include a further module or sensor 2, such as one carried by or embedded in a shoe, as well as a mobile device 3. It is understood that the system 1 could also employ other types of sensors and devices if desired including a heart-rate monitor. As discussed in greater detail below, various components of the system 1 including the wearable device 10 may wirelessly communicate with one another to record and monitor athletic performance or overall user activity. It is further understood that the person may utilize only the wearable device 10 to record and monitor athletic performance or overall activity. The athletic performance data or overall activity can include a variety of different parameters, metrics or physiological characteristics including but not limited to speed, distance, steps taken, and energy expenditure such as calories, heart rate and sweat detection. Such parameters may also be expressed in terms of activity points (e.g., sometimes referred herein as "AP") or currency earned by the user based on the activity of the user.

The shoe-based sensor 2 may have various electronic components including a power supply, magnetic sensor element, microprocessor, memory, transmission system and other suitable electronic devices. The sensor 2 in one exemplary embodiment is mounted on the shoe of a user as shown in FIG. 1. The sensor 2 is used in conjunction with the other components of the system to record data such as speed and distance among other parameters of athletic performance. The sensor 2 can be a sensor as disclosed in U.S. Publication Nos. 2007/0006489; 2007/0011919 and 2007/0021269. These U.S. Publications are incorporated by reference and made a part hereof. The sensor 2 could also take the form of a force-sensor array to collect additional data associated with the user, such as disclosed in U.S. Publication Nos. 2010/0063778 and 2010/0063779, which are incorporated by reference and made a part hereof. The mobile device may be a smartphone or other types of portable display devices. The wearable device assembly 10 may also interact and communicate with other types of sensors including apparel based sensors or sensors associated with events such as running competitions or other athletic competitions.

FIGS. 2-6 illustrate different views of the wearable device assembly 10 of FIG. 1.

The wearable device assembly 10 generally includes a housing 12, a controller 14, an input button 16, a display 18, and an indicator system 20. It is understood that the controller 14 has and/or is operably connected to various associated components including power supplies, sensors and associated circuitry. FIG. 2a illustrates an alternative device 10 having a larger indicator system 20. The structure of the device 10 will first be described followed by a further description of the operation of the device and additional user experiences provided by the device and related systems.

The housing 12 is in the form of a wearable band such as a wristband and generally includes an inner spine member 22 (FIGS. 6-9) having compartments for power supplies, an outer encasement member 24, and a fastening mechanism 26 or latch member 26. In certain exemplary embodiments, the housing 12 may have one or more spacer members 28 to adjust the size of the device 10 to be discussed in greater detail below.

As further shown in FIGS. 2-6, the wearable device assembly 10 is annular or generally circular in shape and, in this illustrative example, is configured for wearing around a user's wrist. The wearable device assembly 10 may be formed in various other shapes without departing from the invention, such as oval, oblong, octagonal, rectangular, and the like. The device 10 may also be configured to be attached to a clip or other device that can be removably attached to a person, or incorporated into other apparel. The wearable device assembly 10 and the housing 12 may include a generally planar portion and rounded or beveled edges along the sides. The beveled edge may only be included on one side of the housing 12 in an exemplary embodiment. Ends of the housing are configured to join with one another via the fastening mechanism 26. In one or more arrangements, an outward or exterior facing side of housing 12 of the wearable device assembly 10 may include a smooth texture while an interior facing side (e.g., contacting the wearer's body) may include frictional features. In one example, the interior facing side of the wearable device assembly 10 may be ribbed to improve traction and prevent slippage around a user's wrist or other body part. The texture may be even throughout the interior side or may be uneven. For example, the ribs or other texture may become more pronounced as the texture progresses away from the fastening mechanism formed at the ends of the housing. In other arrangements, texture might also be added to an exterior side of the wearable device assembly 14 and the interior side may be smooth. Various combinations and configurations of textures may be used. In still other embodiments, the housing 12 may incorporate sweat absorption members on an inner diameter of the device 10 or wicking elements.

As shown in FIGS. 7-9, the inner spine member 22 is a member having substantially rigid portions and certain flexible portions or zones. The spine member 22 generally supports components of the controller 14 as described further herein. The spine member 22 may be considered a chassis member having various components attached thereto. The spine member 22 has a general curvilinear configuration and has an outer surface 30 and an inner surface 32. The spine member 22 has an intermediate portion 34 that extends to a first distal end 36 and a second distal end 38. The intermediate portion 34 has a central portion or central segment 40 as well as a first segment 42 and a second segment 44. The intermediate portion 34 further has a first flexible zone 46 or member that connects one end of the central portion 40 to the first segment 42, and has a second flexible zone 48 or member that connects the other end of the central portion 40 to the second segment 44. The flexible zones 46,48 provide for more easy flexing of the spine member 22 at these zones and also the overall device while the first segment 42 and second segment 44, and central portion 40, are considered rigid zones or substantially rigid zones.

In an exemplary embodiment, the flexible zones 46,48 may be considered flexible hinge zones and are curved segments in a generally concave shape. Thus, the flexible zones have a central portion or base portion with a pair of members extending away from the base portion, and therefore define an inwardly curved portion. The curved segments have a thinned out thickness at the base or central portion of the concave configuration to enhance the flexible characteristics of the flexible zones 46,48. Thus, the spine member 22 has a general thickness or first thickness along its length (e.g., the rigid central portion and rigid first and second segments) while the flexible zones have a lesser, second thickness "t" to assist in the flexible characteristics of the spine member 22 and overall housing 12. In particular, the base portion of the flexible zone has a lesser thickness than the rigid central portion and first and second rigid segments. As explained in greater detail below, the flexible zones 46,48 assist in the components supported by the spine member 22 to be closest to a neutral axis wherein stresses are minimized when the device 10 is flexed such as when placing on a user's wrist or removing the device 10 from a user's wrist.

Figure 7A:
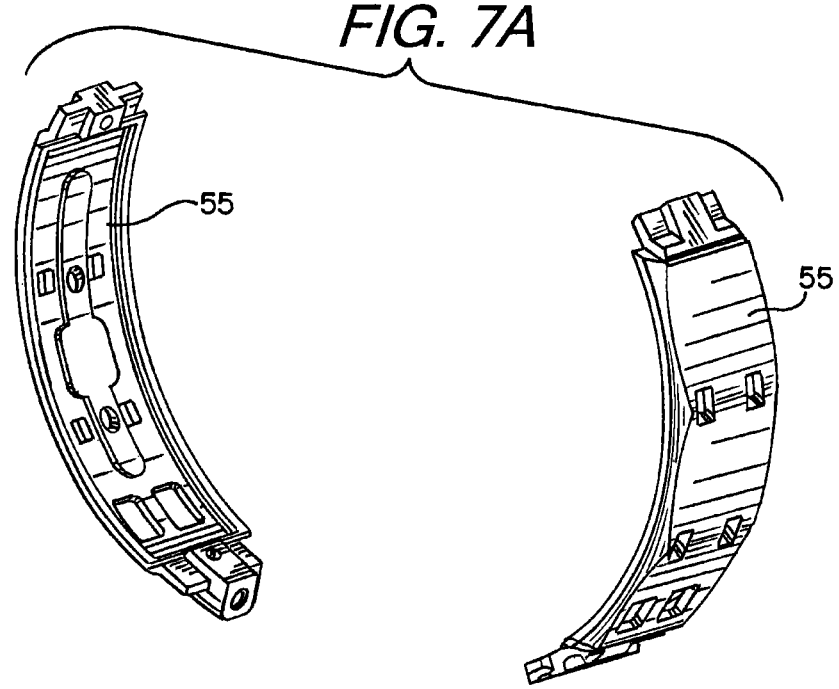
FIG. 7a is a perspective view of battery compartments used in a spine member of the wearable device assembly.
Figure 7B:
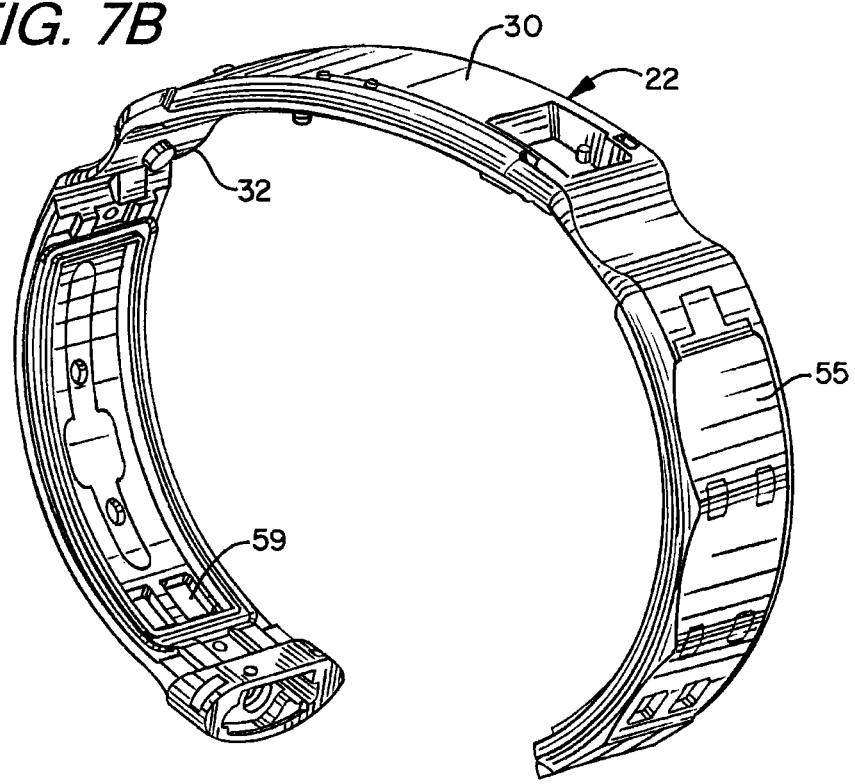
FIG. 7b is a perspective view of the battery compartments as part of the spine member.

As shown in FIGS. 7-9, the first segment 42 of the intermediate portion 34 has a first recessed compartment 50 and the second segment 44 of the intermediate portion 34 has a second recessed compartment 52. These segments have a curvilinear configuration. The recessed compartments 50,52 are dimensioned to receive power supplies associated with the controller 14. In an exemplary embodiment as shown in FIGS. 7a and 7b, the recessed compartments 50,52 are initially formed from a metal enclosure such as a thixo-molded metal member 55. A thixo-molded member is utilized in one exemplary embodiment while other members could also be used such as any cast metal members, die cast members or any metal injected molded members. Metal cover or closure members in the form of metal caps are also provided as described below to provide a metal enclosure for the power supplies. It is desirable to form a metal enclosure for the battery or batteries 142 and it is understood that the enclosure may include confronting metal members that may not form a complete chamber, but substantially surround the battery. It is understood that the thixo-molded compartments can be initially formed wherein the remaining portions of the spine member 22 are formed over the thixo-molded compartments. Portions of the spine member may be formed over the thixo-molded members that define a bottom portion of the compartments 50,52. The compartments 50,52 further have a pair of openings 59 to receive battery terminals or contacts to be described. The recessed compartments 50,52 may vary in size generally or with respect to one another. Thus, the recessed compartments 50,52 may have an increased size to accommodate larger power supplies having increased capacity. Such features will be described in greater detail below.

The intermediate portion 34 further supports other components of the controller 14 proximate the outer surface 30 as well as the display 18 and indicator system 20 as described further below. The spine member 22 may have a beveled edge that supports the indicator system 20 thereon. The spine member 22 has certain openings to receive fastening mechanisms such as adhesives and screw fasteners to fixedly attach controller components to the spine member 22. The first distal end 36 and the second distal end 38 support the fastening mechanism 26 and optional spacers 28.

In one exemplary embodiment, the thixo-molded members 55 that help form the compartments 50,52 are made from magnesium wherein the remaining portion of the spine member 22 is made from a polypropylene material that is formed over the members 55. It is understood that other materials could be used for the spine member 22 as well as the battery enclosures.

As shown in FIGS. 2, 3, 6 and 19, the outer encasement member 24 is positioned around the spine member 22 and encases the controller 14, the display 18 and the indicator system 20. In an exemplary embodiment, the outer encasement member 24 is a thermoplastic elastomer member that is formed in an injection molding process described in greater detail below. Accordingly, the outer casement member 24 has resilient elasticity while maintaining an annular shape. The outer encasement member 24 has a generally rounded outer surface 56 and a generally planar inner surface 58, and may be considered to have an inner portion defining an inner diameter of the device 10 and an outer portion defining an outer diameter of the device 10. The outer surface 56 has a substantially large radius to form a curvature while almost appearing planar. The side edges have a smaller radius than the outer surface and the beveled side edge further has a small radius.

The surfaces of the outer encasement member 24 cooperate to form an internal volume to house the various components of the device while maintaining a minimal cross-sectional dimension. The outer encasement member further has a beveled side edge 60. The indicator system 20 is positioned proximate the beveled side edge 60. It is understood that the housing 12 could have beveled edges on each side edge if desired. The outer encasement member 24 has an aperture 62 to accommodate the input button for interaction with the controller 14. The outer encasement member 24 has a first region 64 to accommodate viewing of the display 18 and a second region 66 to accommodate viewing of the indicator system 20. It is understood that the first region 64 is structured and dimensioned such that indicia projected by the display 18 can be viewed through the first region 64 of the outer encasement member 24. It is further understood that the second region 66 is structured and dimensioned such that indicia projected by the indicator system 20 can be viewed through the second region 66 of the outer encasement member 24.

The outer encasement member 24 may include a colorant providing a dark appearance. The amount of colorant is controlled such that the components encased by the outer encasement member 24 cannot be seen. However, when the display 18 and indicator system 20 are activated, light easily projects through the outer encasement member 24 and is visually perceptible. For example, in one exemplary embodiment, the outer encasement member is translucent thermoplastic elastomer with a certain percentage of colorant. The outer encasement member 24 may further be considered generally transparent but having a tint provided by a certain amount of black pigmented material. In this configuration, the internal components within the outer encasement member 24 are generally not seen, however, when the display 18 and/or indicator system 20 are activated, the light members are clearly seen through the outer encasement member 24. Thus, the internal components are not seen via the naked eye, but the display and/or indicator system can be seen through the outer encasement member when activated. The device 10 may further be configured such that one of the display and indicator system is always visible while the other one of the display and indicator system is viewable only upon activation. For example, the display may always be viewable such as to show time of day, while the indicator system is only viewable when activated. It is further understood that the outer encasement member 24 may be a clear material or include a variety of different colorants, or multiple colorants. Certain colors may indicate a device 10 is specifically designed for certain types of uses or events. The first region 64 and the second region 66 may be constructed to be transparent. In an exemplary embodiment, these regions are tinted to a darker color wherein the display 18 and indicator system 20 are illuminated therethrough.

It is understood that, alternatively, openings can be provided at the first region 64 and the second region 66 for viewing the display 18 and indicator system 20. The inner surface 58 of the outer encasement member 24 has a first opening 68 and a second opening 70 proximate to the location of the power supplies supported by the spine member 22. The first opening 68 is covered by a first cap 72 or closure member secured over the first opening 68 by fasteners, and the second opening 70 is covered by a second cap 74 or closure member secured over the second opening 70 by fasteners. The first cap 72 and the second cap 74 are formed from metal materials to cooperate with the metal battery compartments 50,52 to provide a metal enclosure for the power supplies to be described.

The outer encasement member 24 may be composed of a variety of materials including a variety of polymers, plastics or rubbers, thermoplastic elastomer members, thermoplastic urethane members, liquid silicone members, and rubber composites, and other moldable elastic members, and/or synthetics such as neoprene, plastics, textiles, metals and/or combinations thereof. In one or more examples, the material may include thermo polyurethane and/or thermoplastic rubber. The material used may also offer some flexibility so that the size of the loop formed by the wearable device assembly 10 may be enlarged without fracturing or breaking the assembly 10. As explained in greater detail below, an adhesion promoter may be used on the spine member 22 and components supported thereon to assist in adhesion of the outer encasement member 24. The spine member 22 and outer casement member 24 will be described in further detail below when describing the process of forming the device 10 below.

Figure 6:
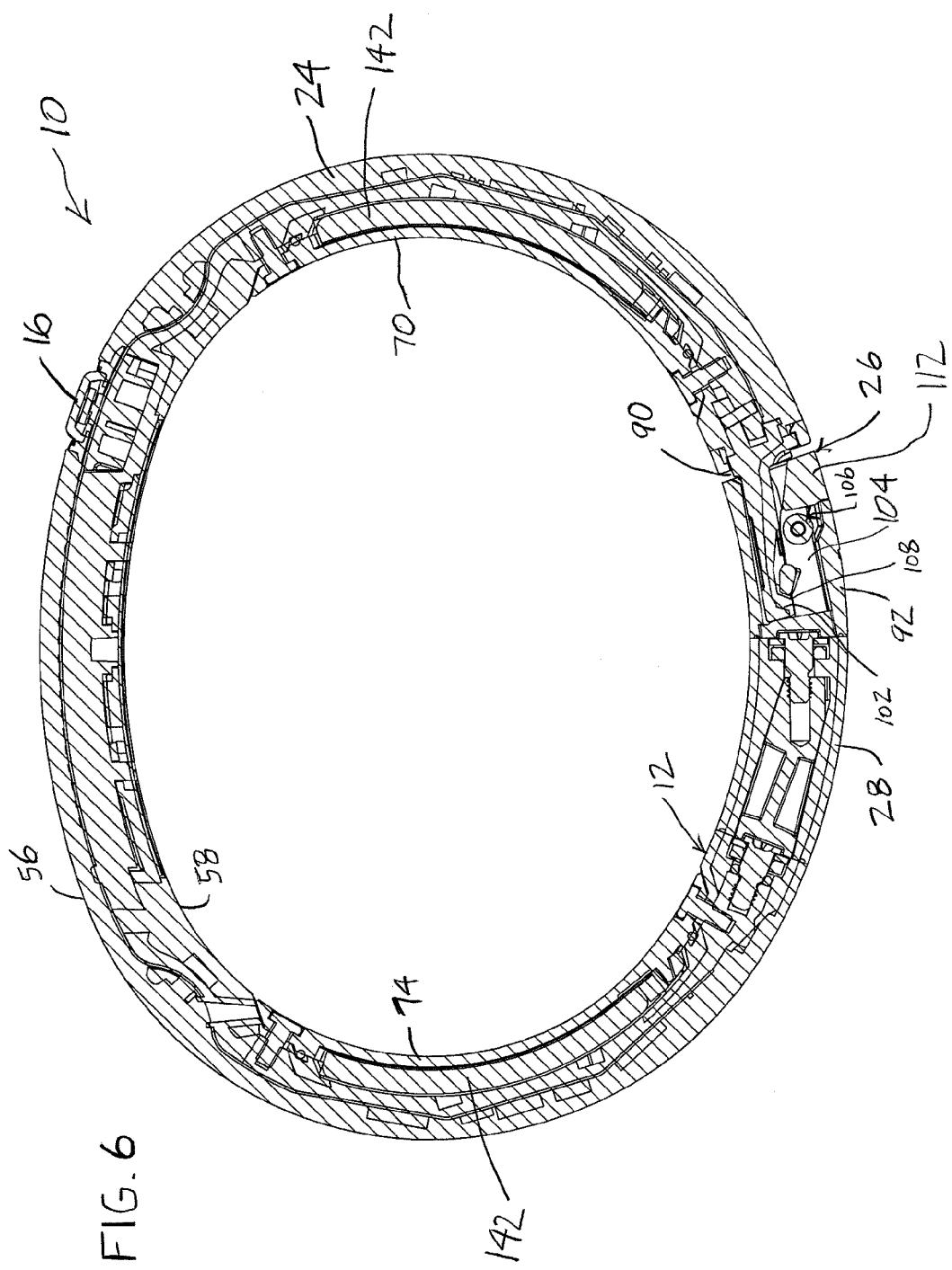
FIG. 6 is a schematic cross-sectional view of the wearable device assembly taken along Lines 6-6 of FIG. 4.

As shown in FIGS. 6, 10 and 11, the fastening mechanism 26 or latch member 26 generally includes a first projection member 90 and a second receiver member 92. The first projection member 90 is positioned proximate the first end of the housing 12, and the second receiver member 92 is positioned proximate the second end of the housing 12. It is understood that the members 90,92 could be placed on opposite ends of the housing 12 if desired. The first projection member 90 incorporates an input/output member 94 for data transfer and in an exemplary embodiment, takes the form of a USB connector 94 having a substantially rigid body 96. The USB connector 94 includes a plurality of leads 98 embedded in a top surface of the rigid body 96. The leads 98 have connectors that are operably connected to the controller 14. As shown in FIG. 10c, the first projection member 90 further has a recess 100 positioned in a bottom surface of the rigid body 96 generally opposite of the USB leads 98. The bottom recess 100 defines an engagement surface 102.

As shown in FIGS. 6 and 11a-f, the second receiver member 92 defines an opening 104 therein and supports a pivoting member 106. The pivoting member 106 has a finger portion 108 and includes a spring 110 to bias the finger portion 108 towards a latching position. The pivoting member further includes a depressible button 112 to move the finger portion 108 away from the latching position. The second receiver member 92 further has a pair of prong members 120 at an opposite end from the opening 104. The prong member 120 has an inclined or curved cam surface 122. A slot 124 is defined along the length of the prong member 120.

As further shown in FIGS. 11a-f, the first projection member 90 is received into the second receiver member 92 that may be connected to one end of the spine member 22 in an embodiment. Initially, the finger portion 108 is pivoted and biased away from the latching position. Once the finger portion 108 passes into the recess 100, the finger portion 108 is biased by the spring 110 into the recess 100 and to the latching position. The device 10 is then in a closed position wherein the finger portion 108 can abut the engagement surface 102 to maintain the device 10 in a closed, annular configuration. While in an exemplary embodiment, the fastening mechanism 26 incorporates a traditional USB connector 94, it is understood that other types of connection configurations for communication could also be employed. For example, the device 10 may utilize a micro USB connector, a Firewire port, a 16-pin pit, or other type of physical contact-based connection, or may include a wireless or contactless communication interface, such as an interface for Wi-Fi, Bluetooth, near-field communication, RFID, Bluetooth Low Energy, Zigbee, or other wireless communication technique, or an interface for infrared or other optical communication technique. It is further understood that the device 10 can be configured to communicate and data transfer completely from a data transfer member such as the USB connector 94, or completely via wireless communication, or a combination of both wireless communication and various types of plug-in communication.

Figure 10A:
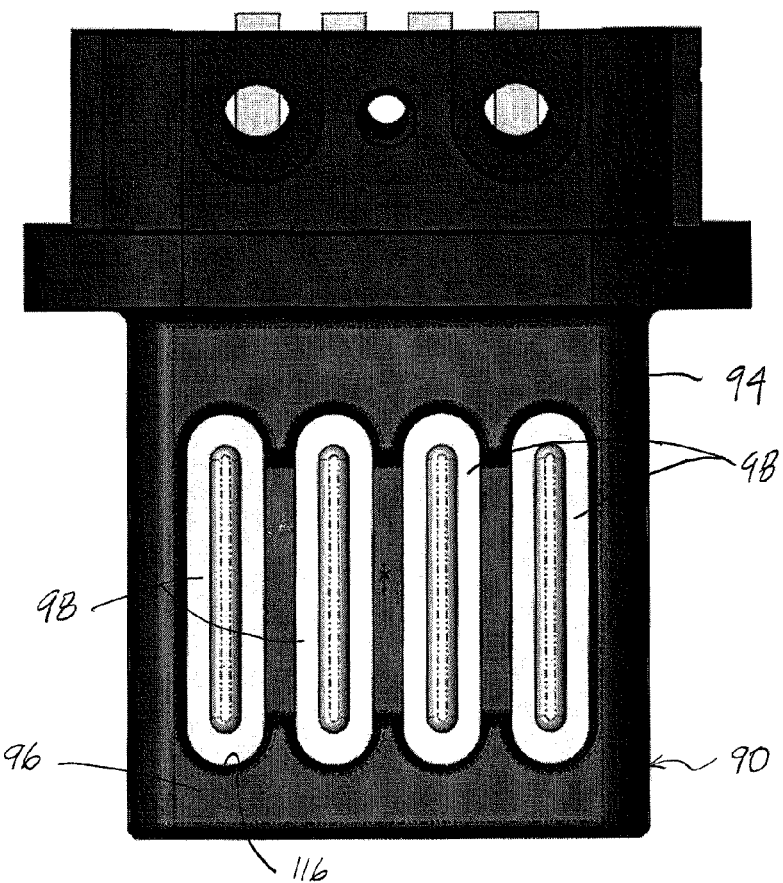
Figure 10B:
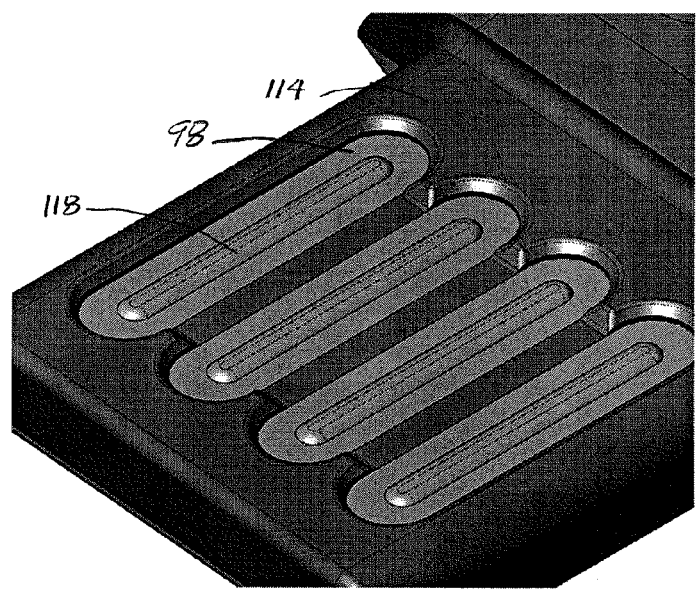
Figure 11E:
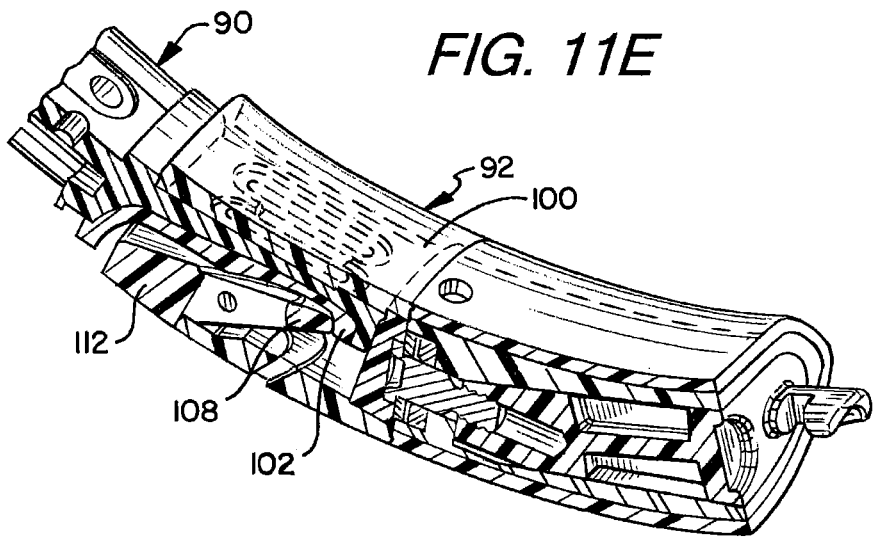

FIGS. 10a-10c disclose additional views of the USB connector 94. The USB connector 94 has structural features that provide a cleaner, more aesthetically pleasing configuration while maintaining operability. In conventional USB connectors, the leads are spaced apart unevenly, are rectangular in shape, and respective ends of the leads are not aligned. As shown in FIG. 10a, the leads 98 of the USB connector 94 are evenly spaced a distance across the rigid body 96. In addition, the leads 98 are recessed with respect to a top surface 114 of the rigid body 96. In addition, the rigid body 96 defines rounded openings 116 that are evenly spaced and wherein the ends of the openings 116 are aligned. The leads 98 are exposed by the openings 116. Because the leads 98 are recessed with respect the top surface 114 of the rigid body 96, each lead 98 has a raised rib 118 that extends proximate the top surface 114 of the rigid body 96. In an exemplary embodiment, the leads 98 are placed in a mold wherein material is injection molded around the leads 98 to form the rigid body having the uniform and aligned rounded openings 116. Such structure provides an enhanced USB connector 94.

The device 10 may be varied in circumferential size wherein the device 10 can define smaller and larger loop configurations to accommodate, for example, different wrist sizes of users. To this end, the housing 12 may incorporate a spacer member 28 or expansion member or element 28 as shown in FIGS. 12-13. It is understood that a single spacer member 28 may be used or multiple spacer members 28 may be used, or not used at all wherein the device 10 simply has the latch mechanism connected at ends of the housing 12. The spacer member 28 cooperates with one end of the housing 12 and one end of the receiver member 92 of the fastening mechanism 26 to increase the circumferential size of the device 10. The spacer member 28 has a body 130 having one end having a pair of openings 132 dimensioned to receive the pair of prong members 120 positioned on the receiver member 92 of the fastening mechanism 26. The body 130 supports a rotary pawl 134 proximate the openings 132. The rotary pawl 134 has a curved cam surface 135 and has a biasing spring 136. The rotary pawl 134 is secured generally at a central location to the body 130 by a fastener and cover plate shown in FIG. 12b. The rotary pawl 134 generally is rotatable about the central location. The other end of the body 130 supports a pair of prong members 137 having cam surfaces 138 similar to the prong members 120 of the receiver member 92.

Figure 11F:
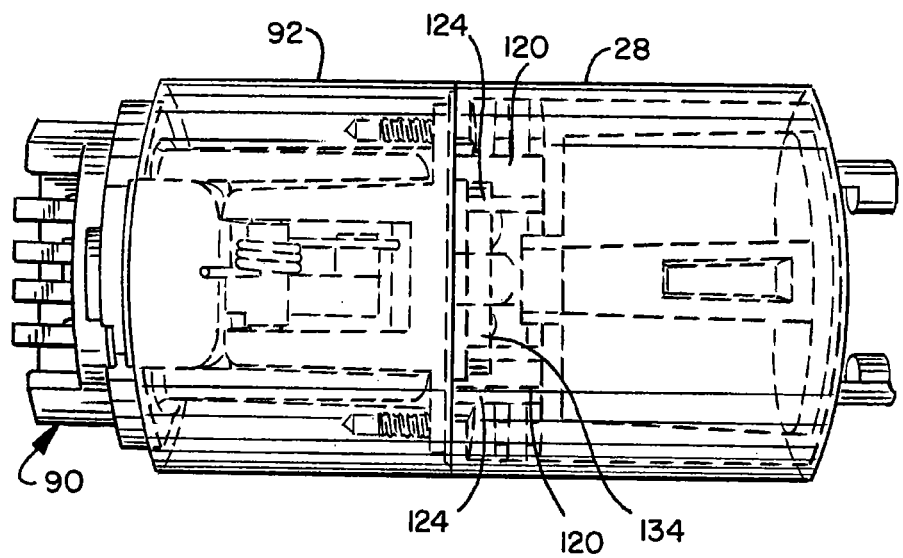

As can be appreciated from FIGS. 11f and 13, when using the spacer member 28, the prong members 137 of the spacer member 28 are received in and secured in openings in an end of the housing 12. This end of the housing 12 has corresponding structure to receive such prong members 137. The prong members 120 on the receiver member 92 of the fastening mechanism 26 are inserted into the pair of openings 132 on the body 130 of the spacer member 28. To this end, the inclined cam surface 122 on the receiver member 92 engages the cam surface 135 on the rotary pawl 134 wherein the rotary pawl 134 rotates (Arrow A in FIG. 12c having cover plate removed for clarity) allowing further insertion of the prongs 120 into the openings 132. Once the slots 124 on the prong members 120 align with the rotary pawl 134, ends of the rotary pawl 134 are received in the slots 124 thereby securing the spacer member to the receiver member 92 of the fastening mechanism 26 (See FIGS. 11f and 13). It is understood that access holes can be provided to rotate the rotary pawl 134 when desiring to remove the spacer member 28 from the device 10. It is understood that multiple spacer elements 28 may be used to increase size or spacer elements 28 could be removed to decrease size. The length of the spacer members 28 may vary and in some cases, may range from 5-10 mm. In one example, the length of the spacer elements 28 may be 8 mm each. In another example, the length of spacer members 28 may be 6 mm. It is further understood that if an expansion element 28 is not used, the prong members 120 on the receiver member 92 cooperate with an end of the housing 12 to be secured thereto. In an exemplary embodiment, the spacer element 28 may have similar construction as the housing such as a plastic body having a thermoplastic member positioned over the body. The prong member 120 may be part of a metal insert into the body. In certain exemplary embodiments, the inner diameters of devices 10 that may utilize spacer members can vary from approximately 147 mm to 221 mm.

The device 10 has the controller 14 that is supported by the housing 12. The controller 14 generally includes a printed circuit board 140 having various components including circuitry, processing units, data storage memory, connectors and other known components as understood in the art. The controller 14 further includes a power supply 142 in the form of a battery pack(s) or batteries 142, an antenna assembly 144 and a sensor assembly 146. The controller 14 could also have other components such as a speaker for conveying audible information.

Figure 14:
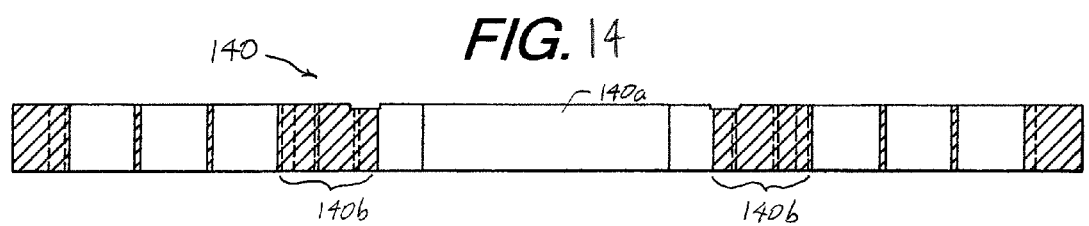
FIG. 14 is a schematic plan view of a flexible circuit member of a controller of the wearable device assembly described herein.
Figure 15:
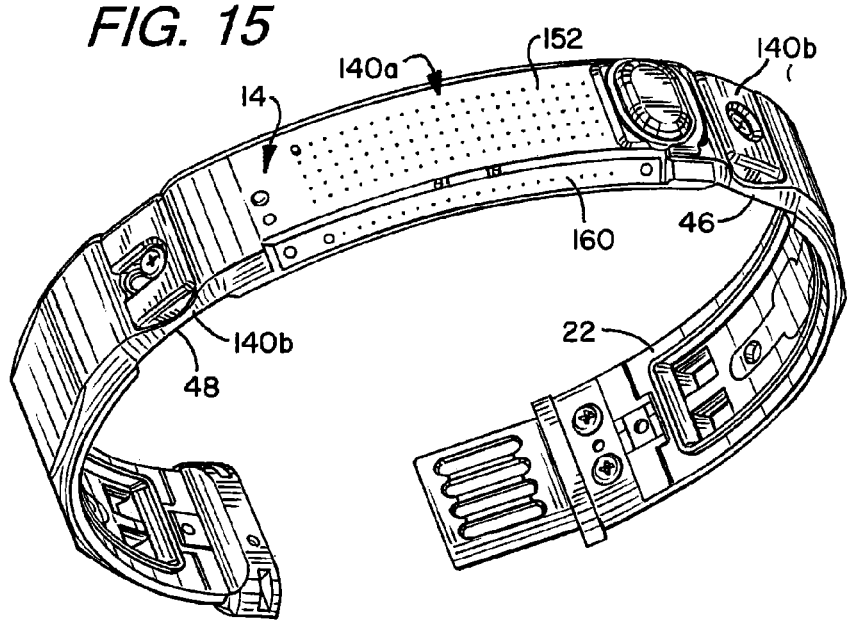
FIGS. 15 and 16 are perspective views of the spine member having certain components of the device attached thereto.
Figure 16:
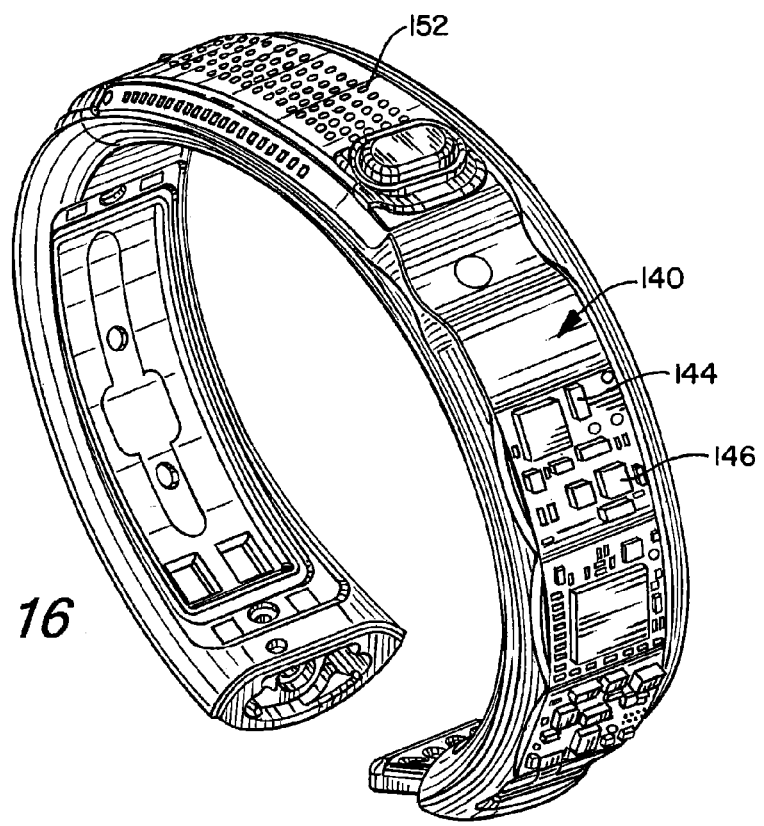

FIG. 14 shows a schematic view of the printed circuit board (PCB member) 140. In an exemplary embodiment, the PCB member 140 is a flexible circuit member. The PCB member has various regions or sections to support the various components thereon. The PCB member further has a central region 140a wherein the display 18 and indicator system 20 are operably connected thereto. The PCB member also has flex regions 140b that will correspond in position to the flexible zones 46,48 of the spine member 22. Other components described herein are also connected to the PCB member 140. As shown in FIGS. 15 and 16, the PCB member 140 is wrapped around and mounted to the spine member 22. Fasteners may be used to fixedly attach the PCB member to the spine member 22. It is understood that the central region 140a of the PCB member corresponds to the central portion 34 of the spine member 22 when connected. The PCB member 140 generally follows the contours of the spine member 22 including the contours of the flexible zones 46,48. Thus, the flex regions 140b are positioned at the flexible zones 46,48 of the spine member 22 and in general surface-to-surface engagement. This configuration allows the PCB member to be moved proximate a neutral axis wherein stress on the PCB member is minimized when the device 10 is flexed.

As discussed, the PCB member 140 supports the various components of the controller 14. For example, the PCB member 140 supports the antenna assembly 144 and the sensor assembly 146. The PCB member further supports data storage memory components. Data storage memory receives input from the sensor assembly and as well as receives inputs from the USB connector 94. Data stored by the controller 14 can also be transferred via the USB connector 94 to another device such as a computer and also to a remote site via the computer.

The antenna assembly 144 supported by the PCB member 140 assists in communication with other mobile devices. Thus, the device 10 is capable of wirelessly communicating with mobile devices, and in one exemplary embodiment, the controller 14 utilizes Blue tooth wireless communication. The controller 14 may, therefore, have a Bluetooth radio and utilizes the antenna assembly 144 wherein the device 10 may wirelessly communicate with a mobile device. It is understood the device 10 is equipped with other necessary components for such wireless communication. Further examples of such communication will be described in greater detail below.

As discussed, the PCB member 140 supports a sensor assembly 146 thereon. The sensor assembly 146 may comprise a plurality of different sensors. In an exemplary embodiment, the sensor assembly 146 comprises an accelerometer in the form of a three-axis accelerometer. As explained in greater detail, the sensor 146 detects movement corresponding to activity of the user wearing the device 10. It is understood that the system 1 and/or controller 14 may also include other sensors as desired. For example, the system 1 utilized by the user may utilize shoe-based sensors that communicate with the device 10. The user may also have apparel based sensors that can communicate with the device 10. It is further understood that the sensor assembly 146 could include a heart rate sensor. The heart rate sensor could be chest mounted sensor if desired. It is understood that the heart rate sensor could also be incorporated into the housing 12 of the device 10 such as a sensor that detects heart rate proximate a wrist of the user. Other sensors could also be utilized such as GPS sensors. Additional sensors may also be incorporated into the device 10. In one exemplary embodiment, the sensor may include a gyroscope sensor. The sensor may be a microelectromechanical system (MEMS) type gyroscope device. Such a sensor may cooperate with other sensors in the device such as the accelerometer to provide enhanced functionality and capabilities as well to provide further differentiation of sensed movements of the user.

As discussed, the controller 14 includes the power supply 142 in the form of batteries 142. It is understood that a single battery 142 could be utilized in the design. Such a design may allow for a flexible circuit member having additional areas to support additional components associated with the device 10. In an exemplary embodiment, however, the power supply 142 utilizes a pair of batteries 142. As can be appreciated from FIGS. 6 and 20, the batteries 142 have a curvilinear or curved configuration and are generally rigid members. The batteries 142 define curved planar surfaces. In an exemplary embodiment, the device 10 utilizes the pair of batteries 142. The first battery 142 is positioned in the first recessed compartment 50 of the spine member 22, and the second battery 142 is positioned in the second recessed compartment 52 of the spine member 22. The batteries 142 have a thickness that generally corresponds to a depth of the recesses 50,52. The batteries 142 are generally flush with the inner surface 32 of the spine member 22. It is understood that the batteries 142 are operably connected to the controller 14 to provide power to the device 10.

Figure 20:
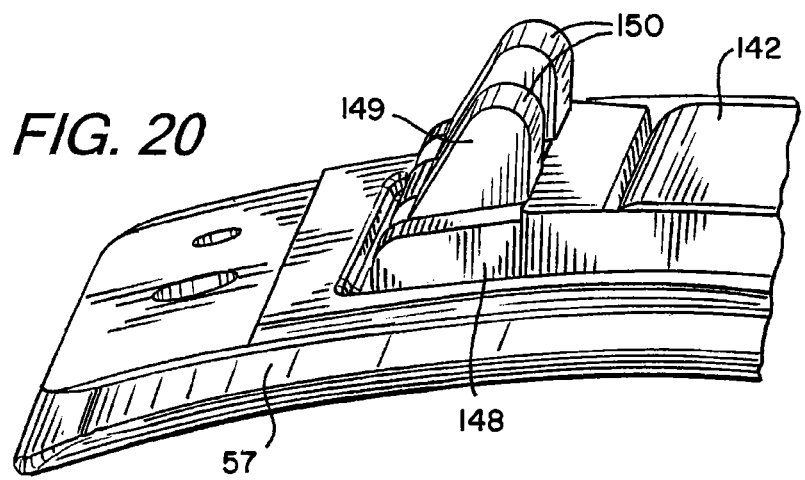
FIG. 20 is a partial perspective view of a battery and closure member and showing contacts of the battery.

As shown in FIG. 20, the batteries 142 have a resilient boot member 148 associated therewith. The boot member 148 has a pair of rounded protrusions 149 and battery contacts 150 of the batteries 142 are adhered over the round protrusions 149. The batteries are positioned in the recessed compartments 50,52 wherein the contacts 150 extend through the openings 59 in the compartments 50,52 and engage the PCB member 140 to provide power to the device 10. When the caps 70,74 are fastened down on the spine member 22, the round protrusions 149 and contacts 150 are resiliently pinched against the PCB member 140 providing an enhanced conductive connection. It is understood that each battery 142 utilizes a resilient boot member 148. In additional exemplary embodiments, a conductive epoxy member may be used to join the battery contacts. The overall size of the batteries 142 and respective recessed compartments 50,52 may vary such being larger to increase battery capacity and life of the device before requiring recharging. It is appreciated that the rigid batteries 142 are mounted in the more rigid first segment 42 and rigid second segment 44 of the spine member 22. The flexible zones 46,48 of the spine member 22 allow the segments 42,44 and batteries 142 to hingedly pivot about the flexible zones 46,48 to provide a generally flexible housing 12 and device 10.

As shown in FIGS. 2-6 and 16-19, the device 10 includes a depressible input button 16 assist in operation of the device 10. As can be appreciated from FIGS. 17 and 18, the input button 16 is operably connected to the controller 14 and supported by the housing 12 generally adjacent the display 18. The input button 16 is accessible to the user via the input button 16 extending past the outer encasement member 24 of the housing 12. The input button 16 has a rigid base member 76 and a flexible cap 78 integrally formed together in a two-shot molding process. An internal chamber 79 is defined by the input button 16 to support a tact switch that can interact with the controller 14. The rigid base member 76 has an upper ring 80 defining a first tool surface 82 and a lower ring 84 adjacent the flexible cap 78 and defining a second tool surface 86. During the process of forming the device 10, the first tool surface 82 and the second tool surface 86 engage a tool in tight surface-to-surface engagement when the outer encasement member 24 is injection molded around the spine member 22 and supported components. This engagement prevents the injection molded material from flowing into the internal chamber 79 of the input button 16 which would prevent the input button 16 from operating correctly. Operation of the device 10 from inputs provided via the input button 16 will be described in greater detail below.

Figure 2:
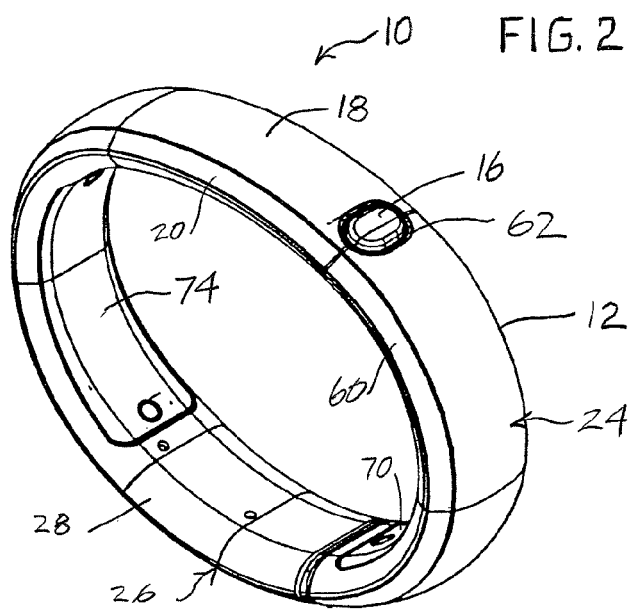
FIG. 2 is a perspective view of the wearable device assembly shown in FIG. 1.

As shown in FIGS. 2 and 15 and 16, the display system 18 or display 18 of the device 10 is supported by the housing 12 and operably connected to the controller 14. The display may be considered an illuminable portion of the device 10 or housing 12. The display system 18 may include a series of individual lighting elements or light members such as LED lights 152 in an exemplary embodiment. The LED lights may be formed in an array and operably connected to the PCB member 140 at the central location. The LED lights 152 may be arranged such that words, letters, numbers, symbols and the like may be produced by lighting various combinations of the individual discrete LED lights 152. For example, LED lights 152 may be arranged in a matrix formation having a specified number of rows and columns. The outer encasement member 24 of the housing 12 surrounds and protects the LED lights 152. As discussed, the outer encasement member 24 has the first region 64 (FIG. 19) and corresponds to the locations of the LED lights 152 so that once the LED lights are illuminated, the light is visible through outer encasement member 24 (in an alternative embodiment, the first region 64 could be made transparent or substantially transparent). It is understood that the first region may be individual and discrete. For example, each of the illumination regions may be surrounded by non-transparent or opaque portions of the outer encasement member 24 such that illumination from each of the LED lights 152 does not blend together. The display system 18 may span only a portion of the total circumference of the wearable device assembly 10. For example, as illustrated in FIG. 2, the display system 18 occupies a top portion or central portion of the device 10 opposite the fastening mechanism 26. The size of the display system 18 (e.g., the number of individual LED lights, number of rows and columns of lights, an overall width or length) may be determined based on a maximum amount of data to be displayed at any one time, a size of the font and/or characters to be used and/or combinations thereof. In one example, the display system 18 may be composed of 5 rows of 20 LED lights 152, wherein each row is substantially parallel to the length of wearable device assembly 10. Additionally or alternatively, the overall exterior circumference (e.g., of an outward facing surface of the device assembly 14) may range from 174-182 mm. It is also understood that the display 18 could include a light member indicating the device 10 is communicating via wireless connection such as Bluetooth communication with a mobile device.

As also shown in FIGS. 2 and 15 and 16, the indicator system 20 of the device 10 is supported by the housing 12 and operably connected to the controller 14. The indicator system 20 may also be considered a portion or component of the overall display 18. The display system of the device 10 may be considered to have a first display and a second display. It is understood that the indicator system 20 can operate and illuminate in conjunction with the display 18 or completely separate from the display 18. The indicator system 20 may also include a plurality of additional lighting elements 160 or light members 160, which may also take the form of LED lights in an exemplary embodiment. The light members 160 are operably connected to the controller 14 and supported by the PCB member 140. The indicator system 20 is positioned generally at the side edge of the housing 12. In one particular example, the indicator system 20 may include a series of twenty lighting elements 160. Optionally, lighting elements 41 may run along both side edges of the housing 12 of the wearable device assembly 10. The lighting elements 160 are also positioned in a generally linear configuration in an exemplary embodiment. The lighting elements 160 of the indicator system 20 may be differently shaped from lights 152 of the display system 18. The difference in shape, size or other appearance attribute may allow a user to identify the type of information being conveyed. The lighting elements 160 may, for example, line one or more of the beveled side edges 60 of the housing 12 of the wearable device assembly 10, allowing for ease of viewing by the user. In the example where the sides or edges of wearable device assembly 14 are rounded, the lighting elements 160 may be positioned on an outer curvature of the rounded edges such that light may be seen when worn (e.g., facing away from the user's wrist or other body part on which the device 14 is worn). Similar to the configuration of lights 152 of the display 18, the outer encasement member 24 has the second region 66 (FIG. 19) that is at locations corresponding to the position of lighting elements 160 of the indicator system 20. Light projected from the light members of the indicator system 20 are viewable through the outer encasement member 24 at the second region 66 (in alternative embodiments, the second region 64 could be transparent or substantially transparent). In one or more arrangements, the appearance of illumination produced by lighting elements 160 may be defined by the size, shape, transparency and other appearance attributes of a corresponding portion of the outer encasement member 24. For example, the lighting elements 160 might actually be circular (e.g., circular bulbs) but may be used to illuminate transparent rectangular regions of the outer encasement member 24, thereby producing rectangular indicators (See e.g., FIG. 2*a*). The plurality of lights 160 of the indicator system 20 may extend around a portion of the circumference of device assembly 10. In one example, the plurality of lights 160 of the indicator system 20 extend generally the same length of the length of the display 18. Spacing between the various plurality of lights of the indicator system 20 and display 18 may also be similar. In another example, the light members 160 may extend around approximately half of the circumference while in other examples, indicators light members 160 may extend around approximately a third of the circumference. In yet another example, the light members 160 may extend around three-quarters or substantially the entire circumference of the wearable device assembly 10. It is also understood that the plurality of lights 160 comprising the indicator system may be grouped together wherein the indicator system may have different segments. The different segments of the indicator system 20 may be illuminated in different configurations as described in greater detail below. Each lighting element 160 may also be considered a separate individual segment of the display. From the configuration of the display 18 and indicator system 20, it is understood that the display 18 may project light in a first direction, and the indicator system 20 may project light in a second direction 20, wherein the first direction is different from the second direction. In one exemplary embodiment, the second direction may be generally transverse to the first direction. It is also understood that the light members of the displays could take other various forms and structures that provide illuminable characteristics.

Figure 8A:
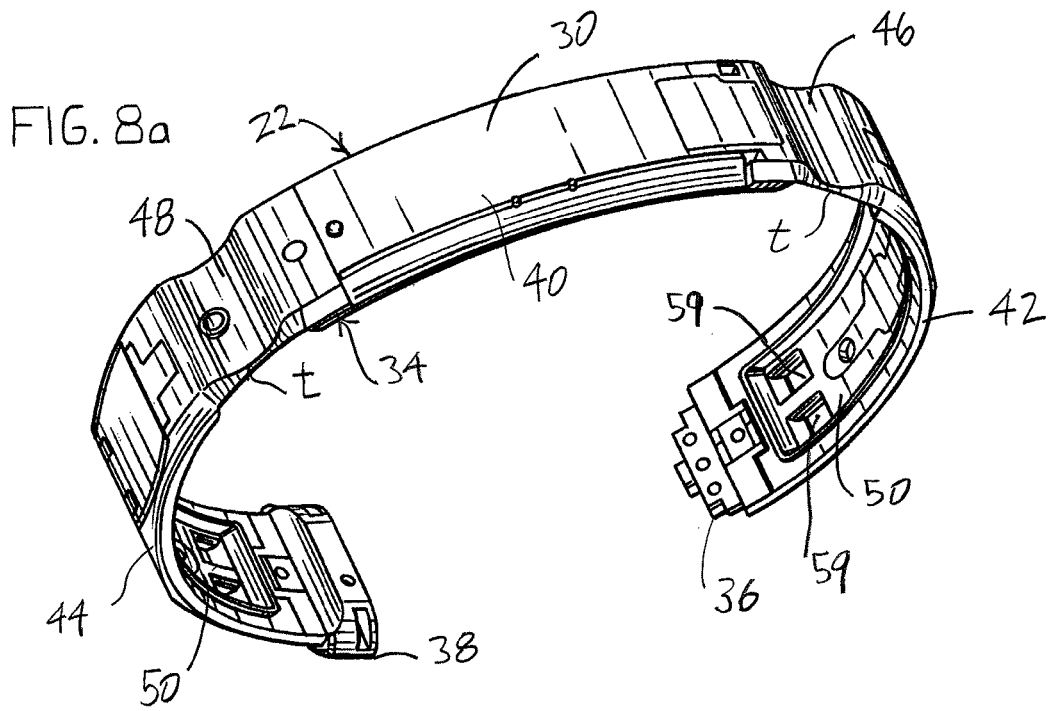
FIG. 8a is a front perspective view of the spine member.
Figure 8B:
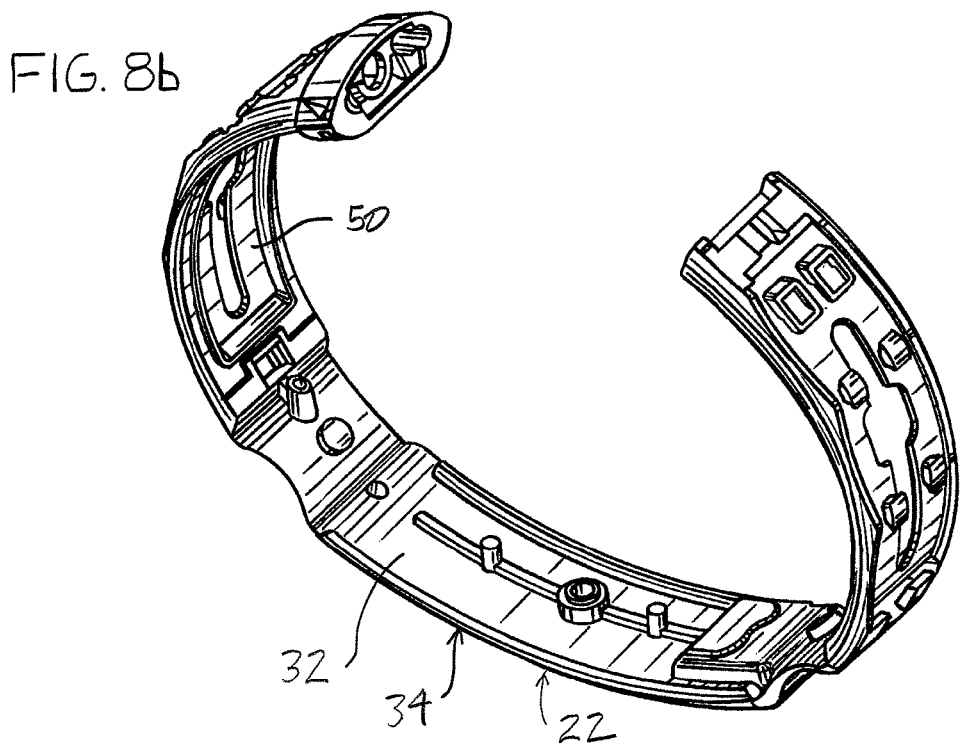
FIG. 8b is an underside perspective view of the spine member.

It is understood that various processes can be utilized in forming the device such as the device 10 shown in FIGS. 1-6. In an exemplary embodiment, a process of forming the spine member 22 initially includes forming the battery compartments. As can be appreciated from FIGS. 7a, 7b, 8a and 8b, a mold is provided wherein via a thixo-molding process, magnesium is injected into the mold to form the thixo-molded members 55. The magnesium thixo-molded members 55 cooperate with the metal battery caps 70,74 (FIG. 2) to provide a substantially metal enclosure for the batteries 142. As discussed, other metal forming processes can be used. Once formed, the thixo-molded members 55 are placed in a mold wherein material is injected into the mold to form the spine member 22. The material is overmolded around the thixo-molded members 55 wherein a certain amount of injected material extends over an internal surface of the members 55 (FIGS. 7-8). It is understood that the mold is designed to incorporate forms for the substantially rigid portions of the spine member 22, the flexible zones 46,48 of the spine member 22 as well as other structures for receiving, mounting or otherwise supporting the various components of the device 10 as described herein. In an exemplary embodiment, the material injected over the thixo-molded members 55 to form the remaining portions of the spine member 22 is polypropylene.

Once the spine member 22 is formed, additional components are connected to the spine member 22. For example, one end of the spine member 22 can be connected with connection structure that will cooperate with either one of the latch mechanism or a spacer element. It is further understood that the USB connector 94 is formed having the features described above. As can be appreciated from FIGS. 10a-10c, the USB leads 98 are provided having the raised ribs 118 formed such as through a stamping process. The leads 98 are placed in a mold wherein plastic injection molded material is formed around the leads 98 to form the rigid body 96 around the leads 98. It is understood that the mold is designed such that the rounded openings 116 are formed and wherein the leads 98 are then spaced apart equally and vertically aligned. While the leads 98 are recessed in the rounded openings, the raised ribs 118 extend to proximate a top surface 114 of the rigid body 96. The mold is also designed to form the recess 100 in the rigid body 96 of the USB connector 94. Once formed the USB connector 94 is connected to an end of the spine member 22 while ends of the leads will be ready to be connected to the controller (FIG. 9).

The spine member 22 with the attached components may then be inserted into a mold wherein an inner diameter portion of the device is overmolded. A thermoplastic elastomer material is injected into the mold to form the inner portion of the housing 12. It is understood that an adhesion promoter may be used wherein the adhesion promoter is applied to the inner surface of the spine member 22 prior to overmolding the thermoplastic elastomer material. The adhesion promoter assists enhances the bonding of the thermoplastic elastomer material to the spine member 22. In one exemplary embodiment, 3M Primer 94 sold by the 3M company is used as the adhesion promoter. It is also understood that the molds are designed such that openings are provided in the inner portion of the housing 12 that are in communication with the recessed compartments 50,52 that will receive the batteries 142.

Figure 17:
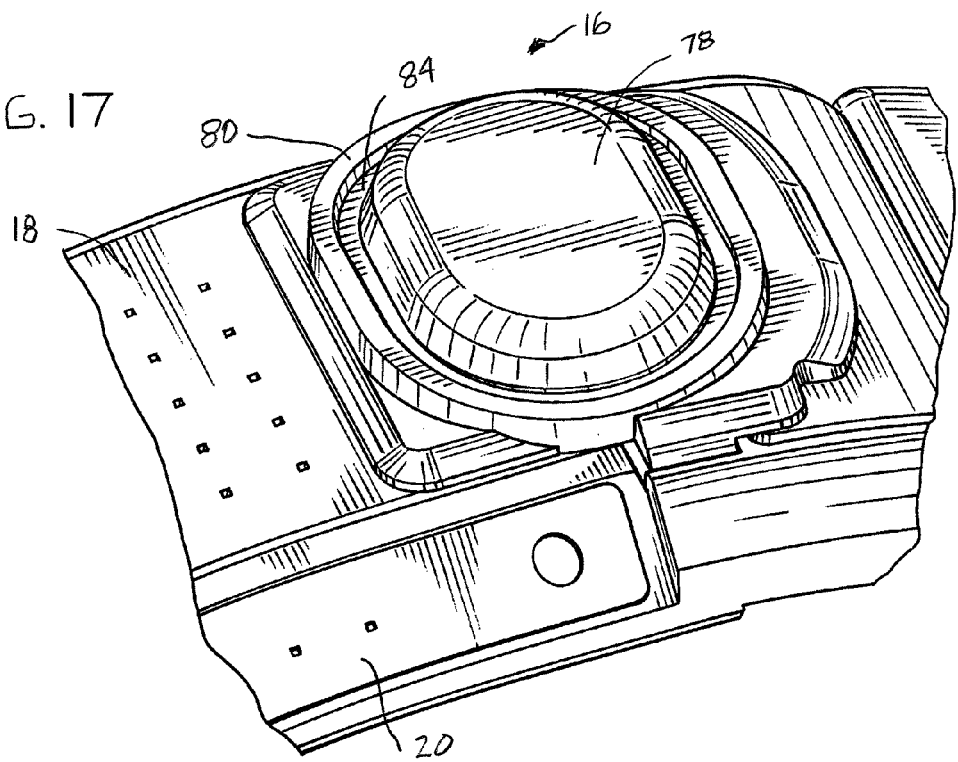
FIG. 17 is an enlarged view of an input button associated with the controller.
Figure 18:
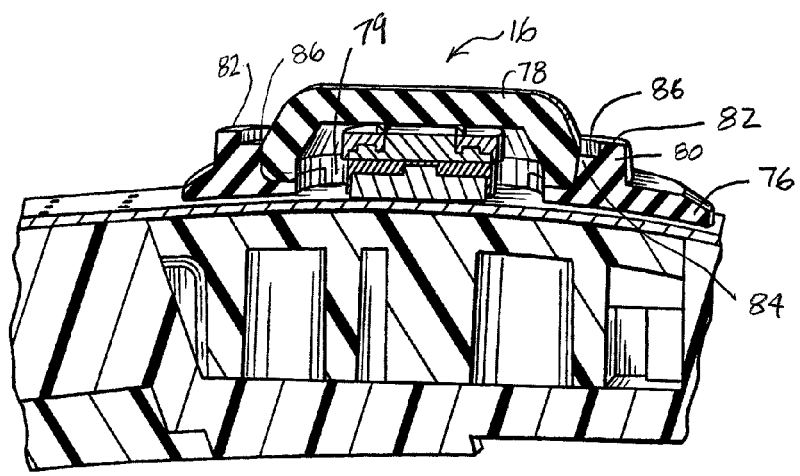
FIG. 18 is a partial cross-sectional view of the input button of FIG. 17.
Figure 19:
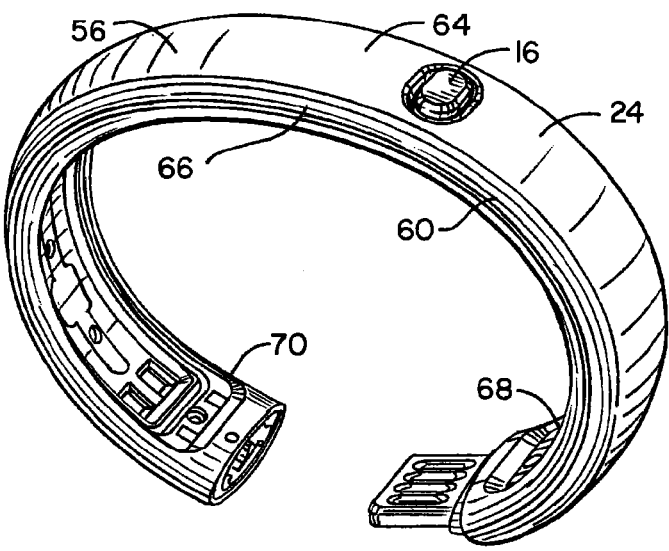
FIG. 19 is a perspective view of the spine member having an outer member formed thereon and showing battery compartments.

Additional components are then ready to be attached to the spine member. As can be appreciated from FIGS. 15 and 16, the PCB member 140 of the controller 14 is formed with the necessary circuitry, other electrical components, antennas, as well as the required sensors including the three-axis accelerometer. In addition, the display 18 and indicator system 20 components are also connected to the PCB member 140. It is further understood that the input button 16 is formed in a two-shot injection molding process wherein the rigid base member is integrally connected to the flexible cap (FIGS. 17-18). The input button is also connected to the PCB member 140. The PCB member 140 is connected to the spine member 22. The PCB member 140 is wrapped onto the spine member and follows the contours of the spine member 22 generally in surface-to-surface engagement including at the flexible zones 46,48 of the spine member 22. (FIGS. 6, 15, 16) The PCB member 140 is fixedly attached to the spine member 22. As discussed, this configuration assists in providing a more neutral axis wherein stresses from flexing are minimized. The ends of the leads of the USB connector 94 are also soldered onto the PCB member 140. The batteries 142 are inserted into the battery compartments (FIGS. 19-20). The raised contacts are positioned through the openings 59 in the battery compartment 50,52 wherein the contacts mate with receiving contacts on the printed circuit board. The battery closure members are fixedly attached to the inner portion of the device via screw fasteners (FIG. 2) wherein the battery contacts are biased against mating contacts associated with PCB member 140.

Figure 19A:
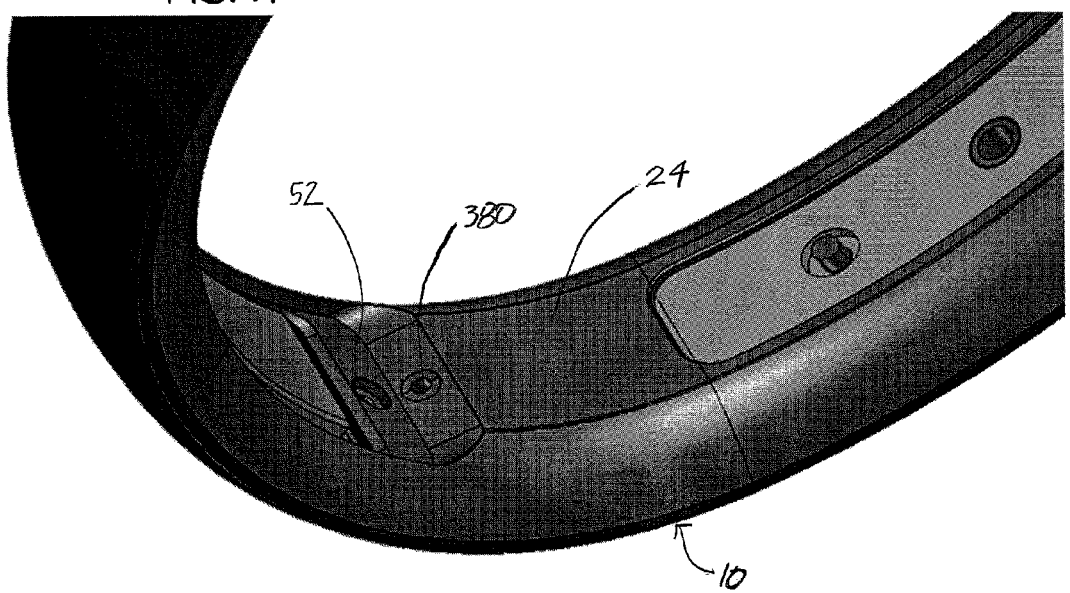
FIG. 19a is an underside perspective view of the device showing a portion of a battery compartment having a port opening.

This intermediate assembly is then inserted into an additional mold for an additional overmolding process. The mold includes a tool that engages the first ring surface 82 and the second ring surface 86 of the input button 16 to prevent the thermoplastic elastomer material from migrating into the internal portions of the input button 16 (FIGS. 17-18). The thermoplastic elastomer material is injected into the mold to complete formation of the outer encasement member 24. In one exemplary embodiment, the spine member 22 includes a tube structure having a port opening 380 wherein the material is injected through the tube structure to form the outer portion of the outer encasement member 24. As shown in FIG. 19a, the port opening 380 is provided in an inclined surface in the battery compartment 52 and is in communication with the tube structure through the spine member 22. Once placed in the appropriate mold member, the injected material is injected through the port opening 380 and flows in the mold to form the outer portion of the outer encasement member 24. It is understood that the port opening 380 could be located in either battery compartment or in other locations on the spine member 22. The port opening 380 could further include multiple port openings. Thus, the various components supported on the spine member 22 are encased in the outer encasement member 24. The thermoplastic elastomer material flows to and engages with a side surface of the input button 16 wherein further migration of the material is prevented by the tool (See FIG. 6). Once the overmolding process is complete, the receiver portion of the latch mechanism and any desired spacer element can be attached (FIGS. 2, 3 and 19). In such configuration, it is understood that the housing 12 is easily flexible to allow for placing the device on a wrist of a user. The device 10 flexes at the flexible zones 46,48 of the spine member 22 wherein it is understood that the rigid segments with the batteries 142 mounted thereon move together. The elastic properties of the outer encasement member 24 readily allow for such pivoting while providing sufficient structure to protect the components supported by the spine member 22.

The device 10 is then formed and ready for operation (FIG. 2). Operation and other user experiences are described below.

The device 10 of the present invention may have numerous alternative structures and configurations. FIGS. 21a-d illustrate schematic side views of alternative embodiments of spine members and batteries that can be used with the device 10 of the present invention. Similar structures may be referred to with similar reference numerals. The spine member 22a has the multiple flexible zones 46a,48a along with the rigid or substantially rigid segments or zones 42a,44a. FIGS. 21a-d illustrate the flexible zones in the form of thinner portions of the spine member 22a. The thinner portions may correspond to more flexible regions while thicker portions of the spine member 22a may correspond to more inflexible areas or rigid zones. It is understood that the spine member 22a more easily flexes or hingedly pivots about the flexible zones. The rigid zones 42a,44a might not be flexible to allow for non-flexible components such as circuit boards, lighting systems, battery packs and other electronics assemblies to be secured. For example, the rigid zones 42a,44a may each include a battery pack 142. Additionally or alternatively, one or more of rigid zones 42a,44a may include circuitry for processing, storing and/or sensing athletic information. The display component may be disposed in an additional central rigid zone generally extending between the rigid zones 42a,44a supporting the batteries. The rigid zones 42a,44a may have a limited amount of flexibility to at least allow for a predefined amount of expansion of device assembly 10.

Figure 21D:
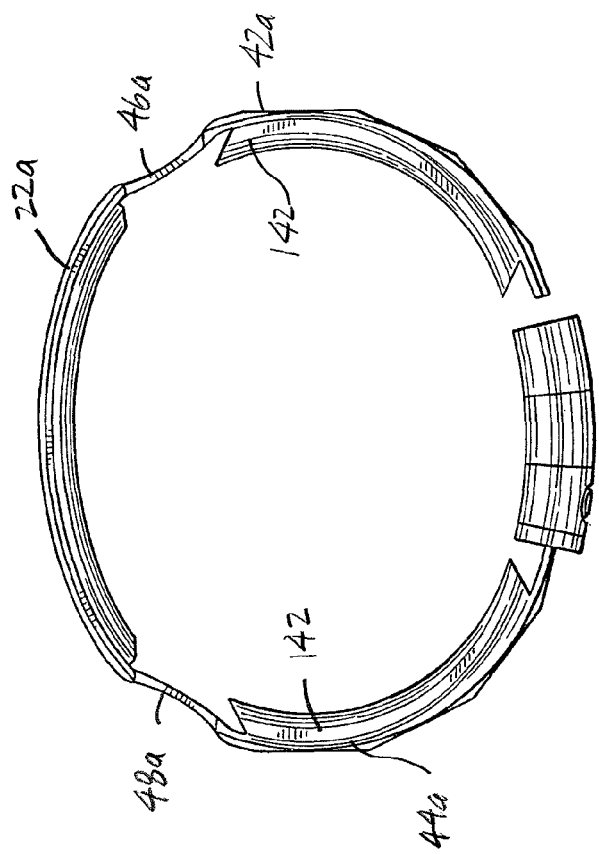
Figure 21C:
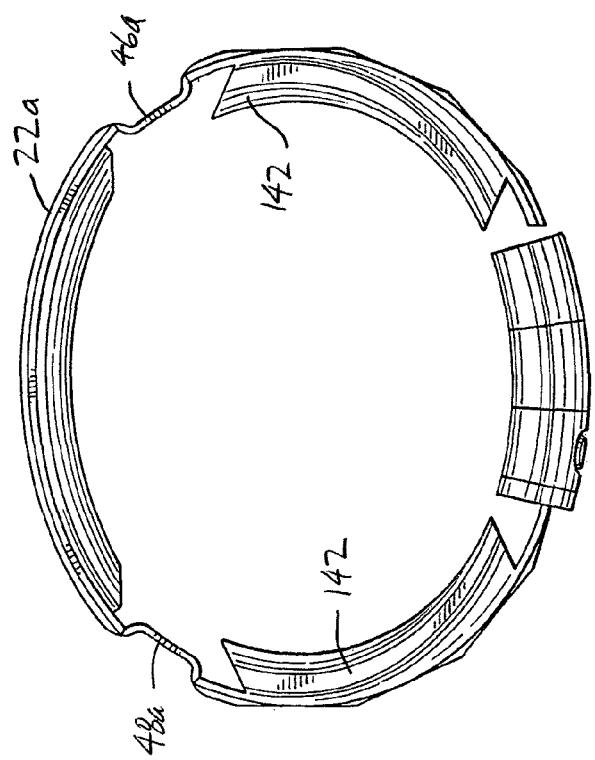

As further can be appreciated from FIGS. 21a-21b, the lengths of battery packs 142 can be adjusted to increase or decrease battery capacity. Due to the changes in the lengths of the battery packs 142, the length or other dimension of display components, indicator system components, or other controller components can also be affected. For example, if the length of battery packs 142 is increased, the size of the display or display may be decreased to compensate. Similarly, in FIGS. 21c-21d, the thickness of the battery packs 142 may be modified to adjust battery capacity and device life. By increasing thickness of the device rather than length, the size of flexible zones may be maximized since there is no expansion of the battery pack 142 along the length of device assembly 10. However, increasing thickness may also increase weight and/or device circumference. The batteries 142 and rigid segment or zones 42a,44a may be cooperatively dimensioned to provide a device 10 having a suitable capacity to record activity and display information prior to requiring recharging.

Power Management for Activity Monitoring Devices

As discussed herein, an activity monitoring device (such as wearable device assembly 10) may be portably powered by one or more batteries or other types of power sources. Because an activity monitoring device may use rechargeable batteries, it is desirable to maximize battery capacity and to obtain accurate battery capacity information. For example, accuracy in remaining battery information may improve a user's ability to plan workouts so that the device is powered through an entire activity session and to properly manage user expectations. Additionally or alternatively, the device may include various processes for maximizing remaining battery power. In one example, such processes may deactivate activity tracking in order to save power for allowing a user to continue viewing data on the device. As discussed further herein, a priority of deactivations may be defined such that a first set of one or more functions or elements are deactivated before a second set of one or more functions or elements, and the second set is deactivated before a third set of one or more functions or elements are deactivated. In one example, activity tracking devices (e.g., accelerometers, heart rate sensors, GPS sensors, gyroscopic sensors, etc.) may be prioritized higher than UI elements like LEDs or certain UI displays. Accordingly, the UI elements or displays may be deactivated before the tracking devices.

Battery capacity may also degrade over time. Accordingly, estimates for an amount of time to charge or discharge the battery completely (or to a predefined amount) may become inaccurate over time if determined based on static charge/discharge curves or other static predefined reference points. Instead, battery charging and discharging time information may be updated so that the data is dynamically modified to improve and maintain accuracy of such information. In one example, an amount of battery charge may be calculated based on a voltage measurement. A table may then be constructed relating battery charge to a corresponding voltage measurement. During use, a device may determine an amount of current charge based on raw voltage measurements and an associated predefined charge. Additionally or alternatively, a device may also use a filtered value. The filtered value may correspond to a moving average of the raw voltage measurements. This filtered value may, in some examples, account for voltage spikes or outliers that might not properly recognize using a single raw measurement. In some arrangements, the filtered value may average the last 2, 3, 5, 10, 15 or any other number of raw measurements.

Figure 22:
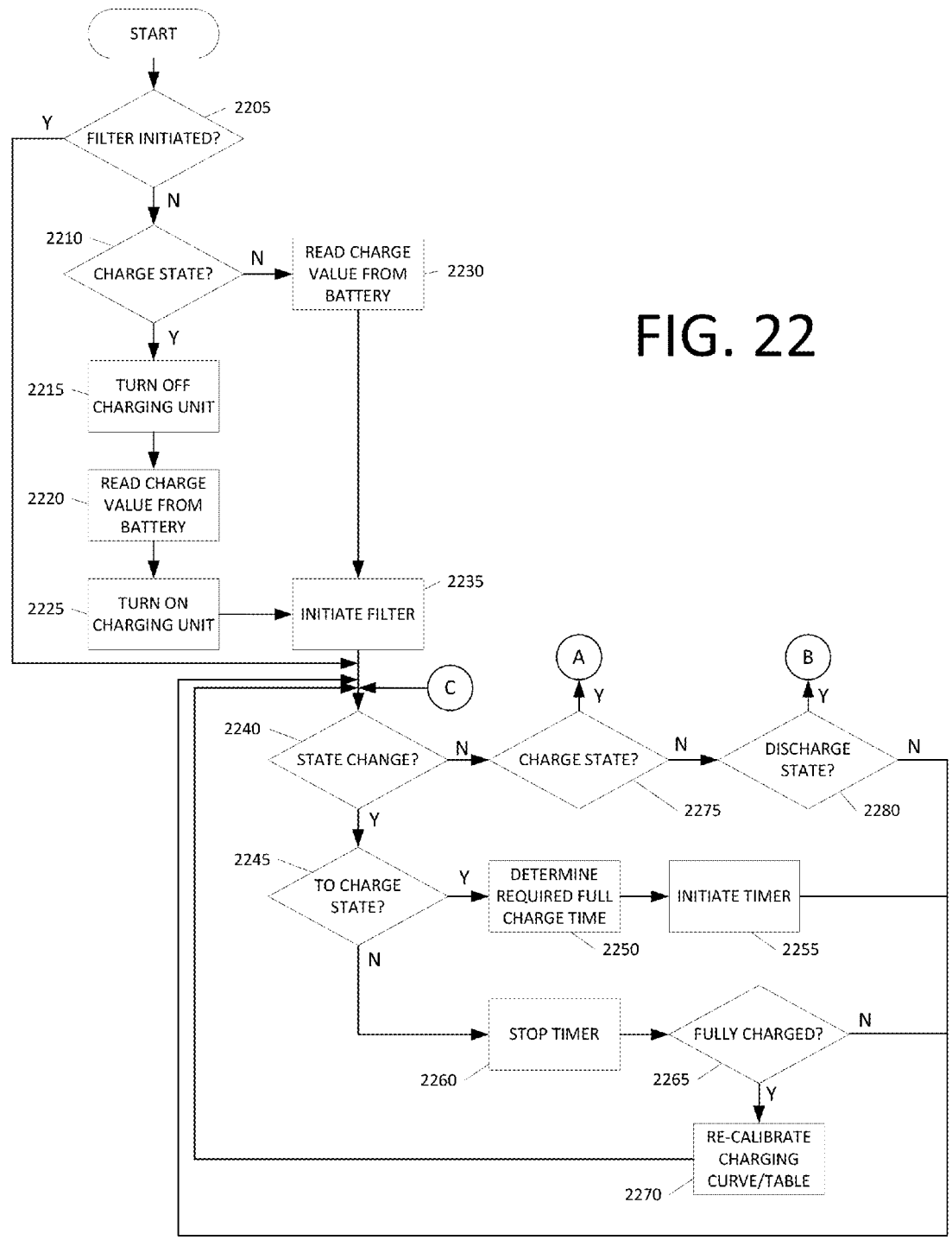
FIG. 22 illustrates an example process for managing battery state detection and information according to aspects described herein.

FIG. 22 illustrates an example power management process that may be used in an activity monitoring device to manage device state changes and to monitor battery charge and charge time. The process may be initiated upon power on of the device or at other predefined times and events such as when a device reaches full charge or when a hard or soft reset occurs. In step 2205, the monitoring device may determine whether a battery charge filter has been initiated. The filter may be an algorithm or process configured to determine a filtered value such as the aforementioned moving average of raw measured battery voltage values. If the filter has not been initiated (e.g., is not operating to calculate the moving average), the device may determine whether the device is currently in a charging state in step 2210. For example, the device may detect whether a charging unit of the device is currently active. If the device is currently in a charging mode, the device may, turn off the charging unit, read the voltage of the battery and subsequently reactivate the charging unit in steps 2215, 2220 and 2225, respectively. Since an accurate voltage reading generally cannot be performed while the device is charging, charging may be temporarily halted so that a more accurate voltage reading of the battery may be obtained. Alternatively or additionally, the voltage reading may be estimated based on a last measured voltage (e.g., raw value) and an amount of charging time elapsed since the voltage was last measured. In yet other examples, the voltage reading may be equated to a last measured or last determined (e.g., estimated, averaged or otherwise calculated) voltage. For example, a previously determined voltage may be used if it was measured or otherwise determined within a predefined amount of time (e.g., 30 seconds, 1 minute, 5 minutes, 10 minutes, etc.). Other methods of determining the battery voltage value may be used as well.

If the device is not currently charging, the voltage may be read from the battery in step 2230 without having to execute a charging unit deactivation/reactivation process. Reading battery values during the discharge state may, in some instances, be subject to various limitations as discussed herein. After the voltage of the battery has been determined, the filter may be initiated by calculating a filter value in step 2235. For example, the monitoring device may calculate a current filter value based on the determined voltage and, if available, one or more previous voltage readings/determinations. As discussed, the filter value may correspond to a moving average of a specified number of most recent voltage values.

Once filtering has been initiated, the monitoring device may, in step 2240, determine whether a state change has occurred within the device. Various states of the device may include a charging state in which the device is charging, a discharging state in which the device is consuming power, a sleep state in which the device may limit functionality to a specified subset of all functions, a wireless communication disabled state, an activity tracking state, a non-activity tracking state and the like. Users may define additional or alternative states as desired. For example, a user may define a new state and specify desired functions and/or hardware components to enable or disable while in the newly defined state. A state change may occur and/or be detected when a user enables or disables a particular mode. For example, if a user plugs in the monitoring device to a power charging source, the state may automatically change from a discharging state to a charging state. In a particular example, such a state change may be detected when the charging unit of the monitoring device is activated.

If a state change has been detected, the monitoring device may further evaluate, in step 2245, whether the state change corresponds to a transition to a charging state (e.g., from a discharging state). If so, in step 2250, the monitoring device may determine an amount of time necessary to charge the device battery from a current amount of battery charge to a fully charged state. The monitoring device may make such a determination based on a table of charge time requirements. For example, a table of voltage-to-charge %-to-time to fully charge may be determined and defined empirically and used as a baseline for determining an amount of time required for the device to charge from a particular voltage (corresponding to a particular charge %) to a fully charged state. The monitoring device may use a last measured voltage as a basis for determining the full charge time. In other examples, the monitoring device may calculate an updated filtered value or use a most recently determined filtered value to determine the full charge time.

FIG. 23 illustrates an example battery charge table for two types of batteries (e.g., large and small). The table specifies a voltage for the two types of batteries in columns 2301 and 2303 along with a corresponding charge percentage in column 2305. Accordingly, in one example, if a voltage of 2800 mvs is read from the battery, the device may determine that the battery is 0% charged based on the correspondence defined in the table. In another example, if the voltage reading is 3692 for a small battery type, the device may determine that the battery is 15% charged. If a voltage reading falls between voltage values specified in the table, the closest, next highest and/or next lowest voltage may be used to determine charge % and/or time to charge. The table illustrated in FIG. 23 is but one example of a predefined association between voltage level, charge and time to charge. Other tables, data structures, values and/or correspondences may also be defined and used including those that include more or less types of batteries.

Returning to FIG. 22, once the charge time has been calculated, the monitoring device may further initiate a timer in step 2255. The timer may be configured to measure the actual amount of time elapsed between the start of charging and full charge completion (or reaching a specified amount of charge). The use of the timer measurements will be discussed in additional detail below. Once the charge time has been calculated and the timer has been initiated, the monitoring device may return to step 2240 to continue monitoring for state changes.

If the state change is to a discharging state (e.g., from a charging state), the monitoring device may, in step 2260, stop the timer and determine an amount of elapsed time. Subsequently, the monitoring device may determine whether the battery has been completely charged in step 2265. If so, the device may update or re-calibrate the voltage charge table in step 2270 based on the determined amount of elapsed time. For example, the time to charge value corresponding to the initial voltage reading (at the start of the charging) may be updated to reflect the determined amount of elapsed time. According to one or more arrangements, the voltage charge table might only be updated when the battery has been completely charged. In other examples, the voltage charge table may be updated even if the battery was not completely charged.

Updating the voltage charge table might only include updating the corresponding charge time for the initial charging voltage (e.g., when the timer was started) without updating or otherwise modifying charge times for other voltage levels. In other examples, however, the device may update the voltage charge table for one or more other voltage levels by interpolating or extrapolating the amount of time required, as appropriate. In a particular example, the charge times defined in the charge table may be fitted to a charge curve defined by a mathematical formula such as charge_time=a*voltage_level$^2$+b. The coefficient a may be held constant, while a new value for b may be calculated based on the starting voltage level and actual elapsed time (e.g., charge time). Using the new calculated value for b, the other voltage levels may be recalculated using the revised charge time curve/formula. In other examples, a formula fitting the entire or a portion of the charge curve may be re-calculated at predefined times (e.g., every 2 months, 6 months, every year, etc.), events (e.g., device hard or soft reset, firmware and/or software update, etc.) or upon user instruction. That is, the curve formula including a slope of the curve may change in view of the updated voltage-charge time values. In still other examples, only certain portions (e.g., charge values for charging from 60% or lower to 100% charge) of the charge curve may be re-calculated/calibrated.

In other arrangements, new charge time values may be determined by selecting a different charge time table from a plurality of predefined charge time tables. For example, multiple charge time tables may be empirically generated for different elapsed times over the life of a battery. In a specific example, a first charge time table may be developed for a 6 month old battery while a second charge time table may be developed for a 12 month old battery. Additional charge time tables may be defined for other battery ages as necessary or desired. Upon determining the actual charge time for the starting voltage level, the device may identify and select one of the plurality of charge time tables reflecting a matching or closest matching charge time-to-voltage level relationship. For example, if a starting voltage of 3718 requires 80 minutes to charge to full capacity, the device may identify a charge table showing an 80 minute charge time for a voltage reading of 3718. If an exact match of 80 minutes is not specified in any of the tables for 3718 mvs, the device may select the closest matching table among the plurality of tables (e.g., 79 minutes for a voltage reading of 3718). The selected table may then be used for all voltage levels until a further update is performed.

After updating the charge times, the monitoring device may return to step 2240 to continue monitoring for changes in state.

If the monitoring device does not detect a state change, the device may continue operating in a charging or discharging state. Accordingly, if the device determines it is currently in a charging state (step 2275), the device may proceed to an example process shown in FIG. 24. Alternatively, if the device determines it is operating in a discharge state (step 2280), the device may execute an example process as shown in FIG. 25. Further details regarding the charge and discharge state operations is described in further detail below.

Figure 24:
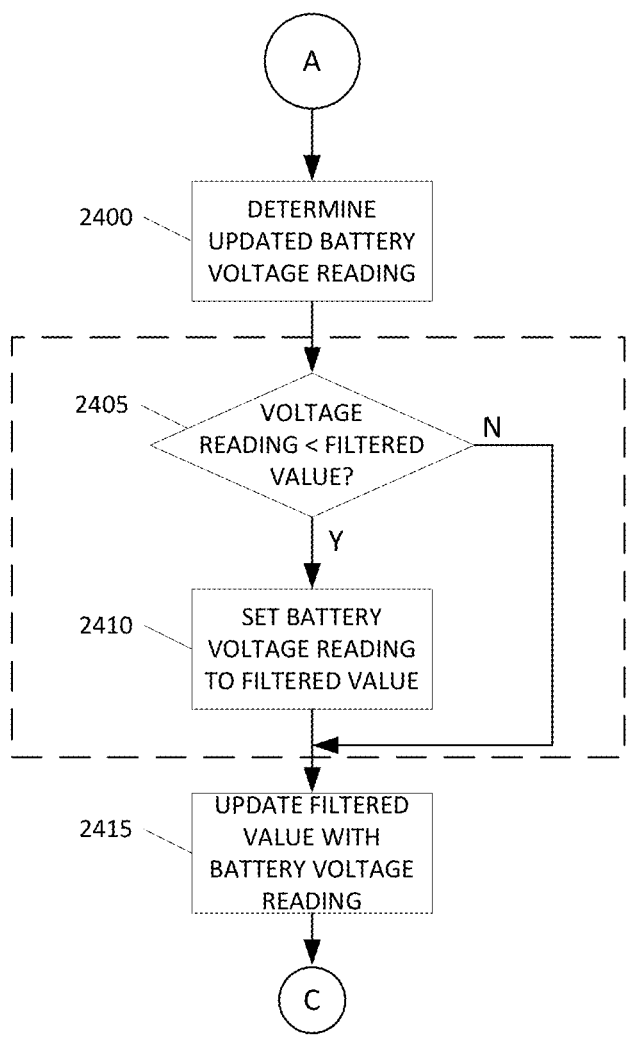
FIG. 24 illustrates an example charging process for a battery operated device according to one or more aspects described herein.
Figure 25:
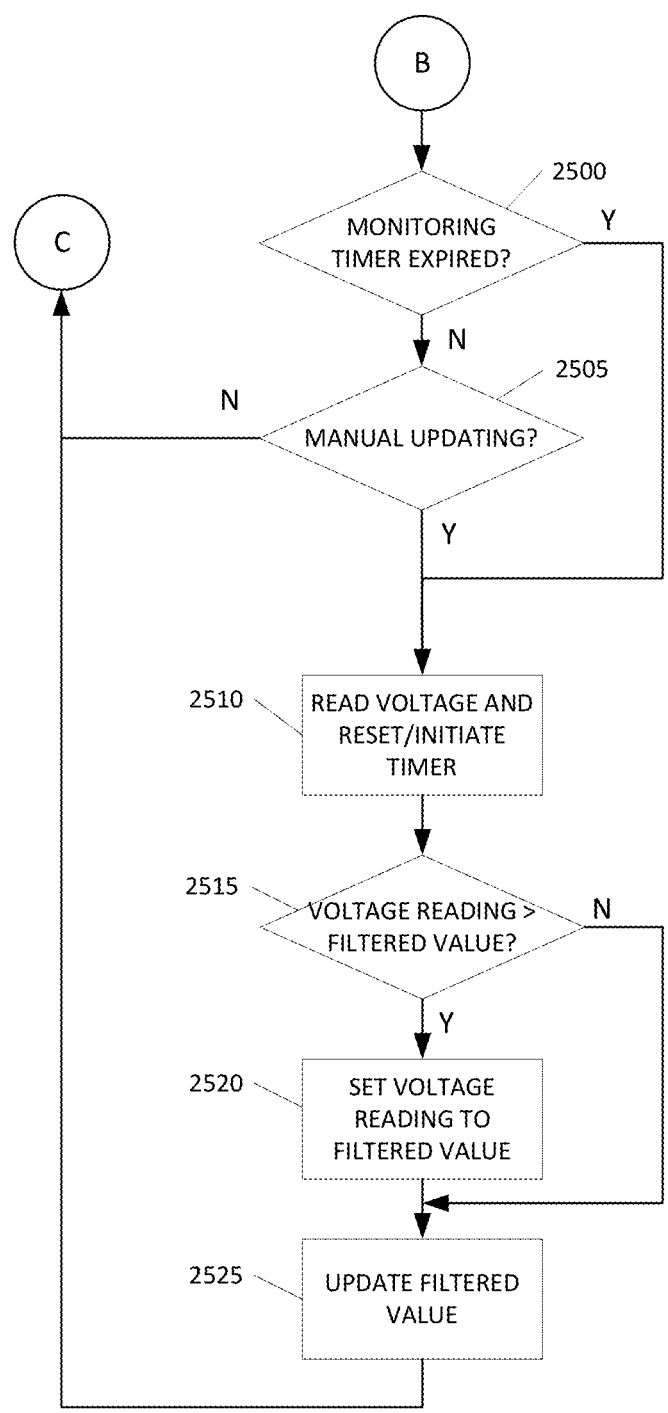
FIG. 25 illustrates an example discharging process for a battery operated device according to one or more aspects described herein.

FIG. 24 describes a process that may be executed while an activity monitoring device such as wearable device assembly 10 is charging. For example, the device may provide updated battery charge information without taking readings from the battery while charging is in progress (e.g., other than taking an initial reading when charging is initiated). By reducing or eliminating the number of readings from the battery, charging does not have to be halted and restarted each time a reading is required. Accordingly, in step 2400, the device may determine an updated battery voltage reading. Determining the updated battery voltage may be performed according to various methods. In one example, the device may determine the updated battery voltage based on the raw battery value read or filtered value determined when charging was initiated. Alternatively or additionally, the device may use a most recent raw or filtered battery voltage value read or determined prior to charging being initiated. The device may further determine an amount of time elapsed since charging was initiated using, for instance, the timer. Using the starting battery voltage and the elapsed time, the device may determine a current battery voltage and corresponding charge (e.g., percentage charged) using a predefined voltage-charge table as described herein (e.g., table shown in FIG. 23). As such, the device does not need to read information (e.g., the voltage) from the battery in order to determine or estimate the current amount of battery charge.

In step 2405, the device may then compare and determine whether the determined current battery voltage value is less than a most recent filtered voltage value. The most recent filtered voltage value might not account for the currently determined battery voltage value. For example, the moving average might not include the currently determined battery value. Alternatively, the most recent filtered voltage value may be updated to include the currently determined battery voltage value (e.g., a moving average including the currently determined battery value). If the current battery voltage value is less than the most recently determined filtered voltage value, the device may set the current battery voltage value to the most recent filtered value in step 2410, rather than using the battery value determined in step 2400. Steps 2405 and 2410 may be performed to ensure that the charge is shown as increasing from a charge level prior to initiation of the charging state. In some arrangements, steps 2405 and 2410 might only be performed a single time, e.g., when the device first enters the charge state. The device may then skip from step 2400 to 2415 thereafter.

In step 2415, the current filtered value may be updated with the currently determined battery value. In the event that the current battery voltage is less than the most recent filtered voltage value (e.g., step 2405 and 2410), the filtered value may remain unchanged. Alternatively, a filtered value might not be used during the charge state. Accordingly, the determined updated battery voltage reading (e.g., an estimated battery voltage) may be used as the value by which a charge level display is updated. The process of FIG. 24 may be performed periodically or aperiodically. For example, the process may be triggered according to a timer as described with respect to FIG. 25.

While charging, the corresponding charge %, as determined from the charge table, may be displayed on the device, on a charging device (e.g., a power adapter or computing device) or the like. In some examples, the charge % might only reach 100% when the charging unit (e.g., an integrated circuit) indicates charging is complete. If the charging unit has not indicated complete charging, but the elapsed time corresponds to a 100% charge, the device might still only display 99% (or the next closest percentage) until the charging unit indicates completion. In some arrangements, the battery charge level is illustrated as an amount of fill in an outline of a battery. Accordingly, the battery display might only be fully filled when the charging unit indicates charging completion.

Alternatively or additionally, a display might not reflect 100% charge until both the elapsed time corresponds to a full charge and the charging unit reflected completion. Accordingly, even if the charging unit indicates that the battery has been fully charged, the display might not show a 100% charge until an amount of elapsed time corresponding to a 100% charge is reached.

If the device is in a discharge state (e.g., not in a charging state), the device may execute a power management/battery monitoring status as described in FIG. 25. For example, in step 2500, the device may determine whether a monitoring timer has expired. The monitoring timer may be different from the charging timer and may be used to trigger updating of the battery voltage reading. If the timer has expired, the device may proceed to step 2510 to update the battery value readings, as further described below. If, however, the monitoring has not expired, the device may, in step 2505, determine whether manual updating of the battery value has been requested (e.g., user input). If not, the device may also return to step 2240 (FIG. 22) to continue monitoring for timer expiration or manual updating or state change.

The monitoring timer (e.g., sampling interval) for reading the battery value during the discharge state may be set to various values. For example, the device may be set to read a battery value every 2 minutes, every 5 minutes, every 10 minutes, every 15 minutes, every 30 minutes and the like (e.g., the sampling interval may become progressively longer (first 1 minute, then 2 minutes, then 5 minutes, sleep (no sampling) etc.). The sampling interval may be user-configurable in some example arrangements. In some instances, sampling might not be executed based on the predefined timer. For example, if the device is currently under a high load condition such as receiving user input (e.g., button presses, touch input), wireless communications, display active, and the like, the device might not conduct sampling. Instead, the device may estimate the amount of charge lost based on each event. Accordingly, each button press may correspond to 0.2% charge lost while each minute of active display may correspond to 0.75% charge lost. Wireless communication may correspond to 0.1%/minute of charge lost. The device might also wait for a predefined amount of time (e.g., 30 seconds, 1 minute, 3 minutes, 5 minutes, 10 minutes, etc.) after a high load condition has ended before sampling the battery value.

In step 2510, the device may read a battery voltage and reset or initiate the monitoring timer. In step 2515, the device may determine whether the read battery voltage value is greater than a current filter value. As discussed herein, the current filter value may or may not include the currently read battery voltage value. If the read battery voltage value is greater than the current filtered value, the device may set the read battery voltage value to the current filtered value instead in step 2520. The process of step 2515 and 2520 may be used to ensure that the amount of remaining battery charge is underestimated so that remaining battery power is not over-reported and the device does not unexpectedly run out of battery power.

In step 2525, the current filtered value may be updated with the currently determined battery value. In the event that the current battery voltage is greater than the most recent filtered voltage value, the filtered value may remain unchanged. The device may then return to step 2240 in FIG. 22.

According to some aspects, in order to maximize battery power, an activity monitoring device may define power profiles that are activated at different remaining power levels. In one example, if the battery reaches a first remaining battery level (e.g., 25%, 30%, 33%, 35%, etc.) a low battery indicator may be displayed or otherwise conveyed. At a second remaining battery level (e.g., 10%, 15%, 17%, 20%, etc.), the device may display a charge indicator (e.g., a plug-in icon) as well as deactivate one or more activity monitoring processes such as calculating an amount of activity performed (e.g., steps taken, calories burned, activity points earned). A deactivation priority may be defined such as deactivating UI features and/or hardware before deactivating data tracking elements and processes. Deactivating such processes may allow the device to conserve power that would otherwise be used by the processor. At a third remaining battery level (e.g., below 10%, below 7%, below 5%, etc.), the device may enter a deep sleep mode. The deep sleep mode may include deactivation of one or more activity sensors, deactivation of user input interrupts, and/or disabling of one or more displays, including in addition to the deactivation of various activity monitoring processes. In some arrangements, less than all sensors may be deactivated (e.g., those that require most power to use) while leaving other sensors activated. In yet other examples, if the device includes more than one display, less than all of the displays may be deactivated. In a particular example, a display requiring the least amount of power may continue to be enabled. According to some configuration, exiting the deep sleep mode may require the device to enter a charging state by being plugged into a power source.

The various functions and hardware disabled or enabled for the various levels may be user-configurable. Moreover, the number of power management levels may also be defined the user as desired or necessary. The user may then define the features of the device that are to be disabled or enabled for each of the various levels.

As described herein, a device may include two batteries. In one example embodiment, the device may check that the battery or batteries are properly connected, e.g., via a general purpose parallel input/output (GPIO) pin or device or software. However, the device might not include a GPIO capability.

In an example embodiment, the device may check the connection of the battery or batteries by measuring the internal resistance of the battery/batteries (which batteries may be connected in serial, parallel, or combination). As an example, such internal resistance may be measured by testing the battery voltage dip while the batteries are under high load. A procedure to do so contemplates (i) turning off a display of the device (i.e., low load condition) and taking a battery measurement under that loading; (ii) turning on the display (i.e., to a selected high or highest load condition) and taking a battery measurement under that loading; and (iii) calculating the voltage dip between the high load and low load conditions. During the factory installation of the battery this procedure may be run while there is 1 battery attached to the system and again when there are 2 batteries attached. When 2 batteries are attached there tends to be less voltage dip because more power can be supplied by the circuit.

In some arrangements, it may be desirable to provide a power management system for the device that requires little to no software management, and that may be implemented with simple and inexpensive components. Such a power management system may provide the following functionality:

a. Automatically switches to USB power when it is available (i.e., no software control needed).
b. Automatically begins charging the battery when USB power is available (i.e., no software control needed).
c. Has an integrated battery PCM, e.g., allowing for more battery in the space designated for the battery.
d. Supports effect "latch up" of the battery (e.g., for storage and shipping), wherein the system is shutdown or otherwise be placed in a state that draws no or nearly no or selected minimal current from the battery (e.g., so the battery is not dead when a user first receives and uses the device).
e. Automatically unlatches the battery when USB power is available. Thereby minimizing or eliminating battery draw when USB is available.

In one or more examples, the device or activity tracking system may use two batteries in parallel (e.g., Lithium Polymer batteries), with a PCM circuit designed into the main circuit such that the batteries are not a protected pack until fully installed in the device or system. The PCM protects from overcharge, overdischarge, overcurrent while charging, and overcurrent while discharging. In a particular example, the charge current is 0.7 C, while the discharge currents are between 0.01 C and an average of 2 C.

Additionally or alternatively, the device or system may be configured to optimize battery life based on an expected device life. Some consumer electronic devices are assumed to have a useful life span of 12-24 months. Time degrades the performance of a battery within the useful life span. In one configuration, device's useful life may be targeted for 18 months. In this particular example configuration, the High Use assumption for charging may be 274 charge cycles, i.e., based on charging the battery every 2 days over the 18 months. In this particular example configuration, the battery design may be specified to meet the following goals, e.g., toward ensuring that the device will meet the targeted 18 month useful life and, possibly, to enable the actual life to extend beyond such userful life, such as in some (usermeaningful) degree. To illustrate, the extension may be challenged to 300, 500 or more charge/discharge cycles, i.e., under High Use cases.

One example of battery capacity retained (based on initial capacity) for the device batteries may be specified as follows:

| 100 Cycles | >95% battery capacity |
|---|---|
| 300 Cycles | >90% battery capacity |
| 500 Cycles | >85% battery capacity |
| 1000 Cycles | >70% battery capacity |

As noted, the device may be a human wearable device that takes the form of an oval/bracelet requiring a volume of space allocated to the batteries to also take this curved or radial profile. Accordingly, the device may include one or more functional batteries of a curved profile. The curved-profile batteries may be produced using a cold forming process where the battery is dynamically fed through a roller/conveyor system and formed over a wheel/mandrel to provide the curved shape. In another example, such batteries may be formed using a hot forming process where the flat battery cell is placed in a cavity and then hot formed by pressing the battery into the cavity, taking the curved profile.

In some aspects, data may be stored in compact manner toward reducing storage requirements and/or battery consumption, e.g., for retrieval and recomposition. In one example, compact binary storage of metric (calorie, steps, EEP, time, etc.) sample data may be used, e.g., as to a memory partition for retrieval and recomposition in external applications (mobile, web, etc.). In a particular example, the compact storage may be as to a flash memory partition. Such may be implemented as, e.g., a designated external serial flash memory partition.

The storage protocol/system may provide one or more of the following:
  page-level (256 byte size) integrity
  sufficient resolution to accurately describe generation of metrics over time
  distinguishable from other forms of data stored on the partition
  versioning-tolerant: changes to the format can be detected by the reader, e.g., with minimal impact
  resilient: data integrity is robustly preserved; corruption of data is recognizable
  capable of supporting selected amount of metadata in regard to each sample, particularly a limited or minimal amount of metadata
  able to describe start and end of sessions (e.g., typically, midnight to midnight)

A storage format or structure may include a page-sized data envelope with a header (class ID and size of payload) and terminating with a CRC marker followed by a CRC. The CRC marker is a secondary point of data validation when read, e.g., by consumers. Within the data envelope are various markers, some followed by data, which markers may include one or more of the following:
  session start markers describing the point at which samples fall into a new session
  session end markers describing the point after which samples fall into a subsequent session
  sample markers, containing sample data and metadata.

In an example, sample markers may have the following characteristics:
  format version number (e.g., for determining compatibility with the consuming application)
  sample id (e.g., 16 bit)
  UTC epoch timestamp (e.g., 32 bit)
  EEP offset (e.g., 16 bit)
  calorie offset (e.g., 16 bit)
  steps offset (e.g., 16 bit)
  distance offset (e.g., 16 bit)
  active time offset (e.g., 16 bit)

By waiting until a page/envelope is filled before saving to flash, the frequency of flash access may be reduced effectively, i.e., in that the page/envelope might only need to be saved when an envelope is filled or upon certain context changes (as in a reset or change to the bootloader). It also provided a determined location for the CRC. As envelopes are stored into flash, the write pointer address may be maintained in RAM, and saved to nonvolatile storage upon power state change, memory high watermark, USB state change, or upon request. On initialization, the application reads this address into RAM for continued use. When data is read from the device, requested from a specific memory offset, if that offset is within the bounds of written sample storage within external flash, data is returned from external flash, up to the point that it reaches the write pointer address. Additional data is pulled from RAM, from the envelope as it is being filled. The CRC is only added just before write to external flash.

The above described processes may be used in activity monitoring devices having a plurality of batteries as discussed herein. For example, the charge amount for each battery may be calculated separately and added together to present an overall charge amount. Alternatively or additionally, separate charge amounts and values may be reported for each of the batteries separately.

Moreover, the above described power management processes may be used in a variety of devices and is not limited to athletic activity monitoring devices. For example, batteries for other portable devices such as portable media devices, mobile communication devices and the like may use similar power management and charging methods to maximize battery life and provide accurate battery state information.

CONCLUSION

While the invention has been described with respect to specific examples including presently preferred modes of carrying out the invention, those skilled in the art will appreciate that there are numerous variations and permutations of the above described systems and methods. For example, various aspects of the invention may be used in different combinations and various different subcombinations of aspects of the invention may be used together in a single system or method without departing from the invention. In one example, software and applications described herein may be embodied as computer readable instructions stored in computer readable media. Also, various elements, components, and/or steps described above may be changed, changed in order, omitted, and/or additional elements, components, and/or steps may be added without departing from this invention. Thus, the invention should be construed broadly as set forth in the appended claims.

What is claimed is:
1. A method comprising:
  detecting, by an athletic activity monitoring device, entry of the athletic activity monitoring device into a battery charging state;

determining, by the athletic activity monitoring device, an initial charge value of a battery of the athletic activity monitoring device at or prior to entry into the battery charging state;

activating a charging unit of the athletic activity monitoring device in response to detecting entry of the athletic activity monitoring device into the battery charging state and upon determining the initial charge value of the battery, wherein activating the charging unit changes a charge value of the battery;

determining, by the athletic activity monitoring device, an elapsed amount of time since activation of the charging unit;

determining, by the athletic activity monitoring device, a current amount of battery charge based on the elapsed amount of time and the initial charge value of the battery without a subsequent reading of a voltage from the battery using a look-up table associating a charge amount of the battery with an amount of time required to charge the battery from the charge amount of the battery to a fully charged state;

deactivating the charging unit of the athletic activity monitoring device in response to detecting a change in state of the athletic activity monitoring device from the battery charging state;

determining, by the athletic activity monitoring device, a final charge value of the battery upon deactivation of the charging unit;

determining whether the final charge value corresponds to a fully charged state;

upon determining the final charge value corresponds to the fully charged state, measuring an elapsed amount of time to charge the battery from the initial charge value to the fully charged state; and automatically updating the look-up table with the measured amount of time.

2. The method of claim 1, wherein the initial charge value includes an amount of voltage output from the battery.

3. The method of claim 1, wherein determining the current amount of battery charge includes:

determining an initial charge amount of the battery at or prior to entry into the battery charging state based on the initial charge value;

determining an amount of time required to charge the battery from the initial charge amount to a fully charged state; and determining an expected remaining charge time based on the elapsed amount of time and the amount of time required to charge the battery from the initial charge amount to the fully charged state.

4. The method of claim 3, further comprising determining the current amount of battery charge based on a look-up table using the expected remaining charge time as a key.

5. The method of claim 1, wherein the athletic activity monitoring device includes the charging unit and wherein the method further comprises:

determining an expected amount of time required to charge the battery from an initial charge amount of the battery corresponding to the initial charge value to a fully charged state; and determining that the battery is fully charged in response to:
 receiving an indication, from the charging unit, of battery charge completion; and
 determining that the expected amount of time to charge the battery from the initial charge amount to the fully charged state has elapsed.

6. The method of claim 1, wherein determining the current amount of battery charge includes determining a current amount of battery charge for each of a plurality of batteries in the athletic activity monitoring device.

7. A non-transitory computer readable medium storing computer readable instructions that, when executed, cause an athletic activity monitoring device to:

detect entry of the athletic activity monitoring device into a battery charging state;

determine an initial charge value of a battery of the athletic activity monitoring device at or prior to entry into the battery charging state;

activate a charging unit of the athletic activity monitoring device in response to detecting entry of the athletic activity monitoring device into the battery charging state and upon determining the initial charge value of the battery, wherein activating the charging unit changes a charge value of the battery;

determine an elapsed amount of time since activation of the charging unit;

determine a current amount of battery charge based on the elapsed amount of time and the initial charge value of the battery without a subsequent reading of a voltage from the battery using a look-up table associating a charge amount of the battery with an amount of time required to charge the battery from the charge amount of the battery to a fully charged state;

deactivate the charging unit of the athletic activity monitoring device in response to detecting a change in state of the athletic activity monitoring device from the battery charging state;

determine a final charge value of the battery upon deactivation of the charging unit;

determine whether the final charge value corresponds to a fully charged state;

upon determining the final charge value corresponds to the fully charged state, measure an elapsed amount of time to charge the battery from the initial charge value to the fully charged state; and automatically update the look-up table with the measured amount of time.

8. The non-transitory computer readable medium of claim 7, wherein the initial charge value includes an amount of voltage output from the battery.

* * * * *